(12) United States Patent
Gallagher et al.

(10) Patent No.: US 11,605,754 B2
(45) Date of Patent: Mar. 14, 2023

(54) PARTIAL LASER LIFTOFF PROCESS DURING DIE TRANSFER AND STRUCTURES FORMED BY THE SAME

(71) Applicant: GLO AB, Lund (SE)

(72) Inventors: Timothy Gallagher, Los Altos Hills, CA (US); Anusha Pokhriyal, Sunnyvale, CA (US)

(73) Assignee: NANOSYS, INC., Milpitas, CA (US)

( * ) Notice: Subject to any disclaimer, the term of this patent is extended or adjusted under 35 U.S.C. 154(b) by 163 days.

(21) Appl. No.: 17/116,065

(22) Filed: Dec. 9, 2020

(65) Prior Publication Data

US 2021/0184072 A1 Jun. 17, 2021

Related U.S. Application Data

(60) Provisional application No. 62/946,557, filed on Dec. 11, 2019.

(51) Int. Cl.
| | | |
|---|---|---|
| H01L 33/62 | (2010.01) | |
| H01L 33/00 | (2010.01) | |
| H01L 21/268 | (2006.01) | |
| H01L 25/075 | (2006.01) | |
| H01L 21/683 | (2006.01) | |

(52) U.S. Cl.
CPC ........ *H01L 33/0062* (2013.01); *H01L 21/268* (2013.01); *H01L 21/6835* (2013.01); *H01L 25/0753* (2013.01); *H01L 33/0095* (2013.01); *H01L 33/62* (2013.01)

(58) Field of Classification Search
CPC ............... H01L 33/0062; H01L 21/268; H01L 21/6835; H01L 25/0753; H01L 33/0095; H01L 33/62; H01L 2933/0066; H01L 24/10; H01L 2221/68322; H01L 2221/68354; H01L 2221/68381
USPC .......................................................... 438/22
See application file for complete search history.

(56) References Cited

U.S. PATENT DOCUMENTS

| | | | |
|---|---|---|---|
| 8,334,152 B2 | 12/2012 | Speier | |
| 8,455,880 B2* | 6/2013 | Park | ...................... H01L 33/025 257/76 |
| 9,941,262 B2 | 4/2018 | Thompson | |
| 10,177,123 B2 | 1/2019 | Gardner et al. | |

(Continued)

FOREIGN PATENT DOCUMENTS

| | | |
|---|---|---|
| KR | 10-2011-0111209 A | 10/2011 |
| KR | 10-2015-0074321 A | 7/2015 |

OTHER PUBLICATIONS

Notification of Transmittal of the International Search Report and the Written Opinion of the International Searching Authority for International Patent Application No. PCT/US2020/063895, dated Apr. 9, 2021, 10 pages.

(Continued)

*Primary Examiner* — Vu A Vu
(74) *Attorney, Agent, or Firm* — The Marbury Law Group PLLC

(57) ABSTRACT

A transfer method includes providing a first light emitting diode on a first substrate, performing a partial laser liftoff of the first light emitting diode from the first substrate, laser bonding the first light emitting diode to the backplane after performing the partial laser liftoff, and separating the first substrate from the first light emitting diode after the laser bonding.

20 Claims, 29 Drawing Sheets

(56) References Cited

U.S. PATENT DOCUMENTS

| | | |
|---|---|---|
| 10,193,038 B2 | 1/2019 | Farrens et al. |
| 10,304,810 B2 | 5/2019 | Gardner et al. |
| 10,553,767 B2 | 2/2020 | Danesh et al. |
| 10,607,877 B2 * | 3/2020 | Lee .................... H01L 25/0753 |
| 10,714,464 B2 | 7/2020 | Pokhriyal et al. |
| 10,804,436 B2 | 10/2020 | Danesh et al. |
| 2010/0258543 A1 | 10/2010 | Mizuno et al. |
| 2011/0151602 A1 | 6/2011 | Speier |
| 2017/0162552 A1 | 6/2017 | Thompson |
| 2017/0236811 A1 | 8/2017 | Pokhriyal et al. |
| 2017/0288102 A1 | 10/2017 | Farrens et al. |
| 2017/0373046 A1 | 12/2017 | Gardner et al. |
| 2018/0198047 A1 | 7/2018 | Danesh et al. |
| 2018/0366450 A1 | 12/2018 | Gardner et al. |
| 2019/0109262 A1 | 4/2019 | Danesh et al. |
| 2019/0326478 A1 | 10/2019 | Danesh et al. |
| 2020/0127168 A1 | 4/2020 | Danesh et al. |
| 2020/0176634 A1 | 6/2020 | Batres et al. |

OTHER PUBLICATIONS

Notification Concerning Transmittal of International Preliminary Report on Patentability and the Written Opinion of the International Searching Authority for International Patent Application No. PCT/US2020/063895, dated Jun. 23, 2022, 6 pages.

* cited by examiner

FIG. 2

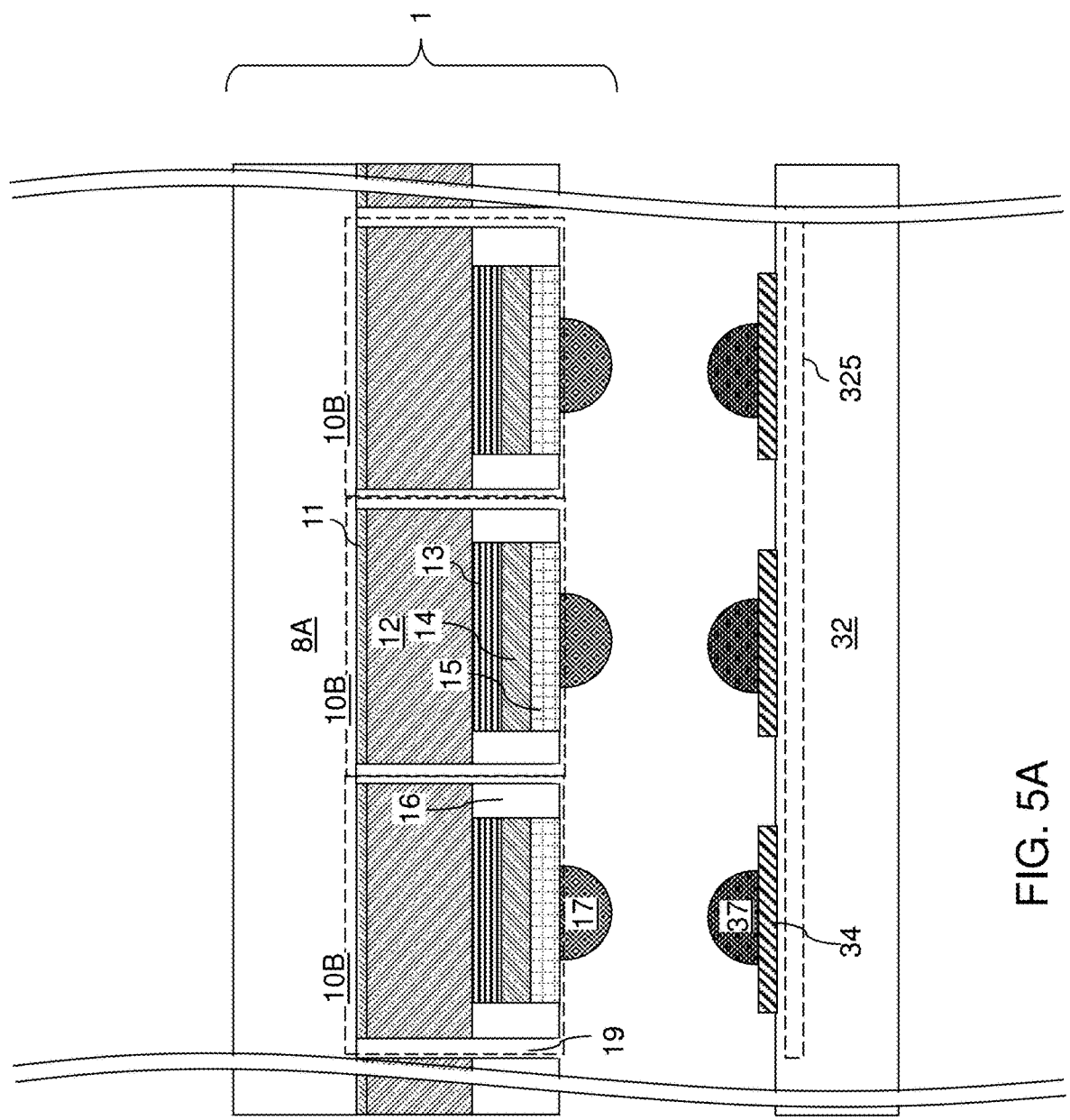

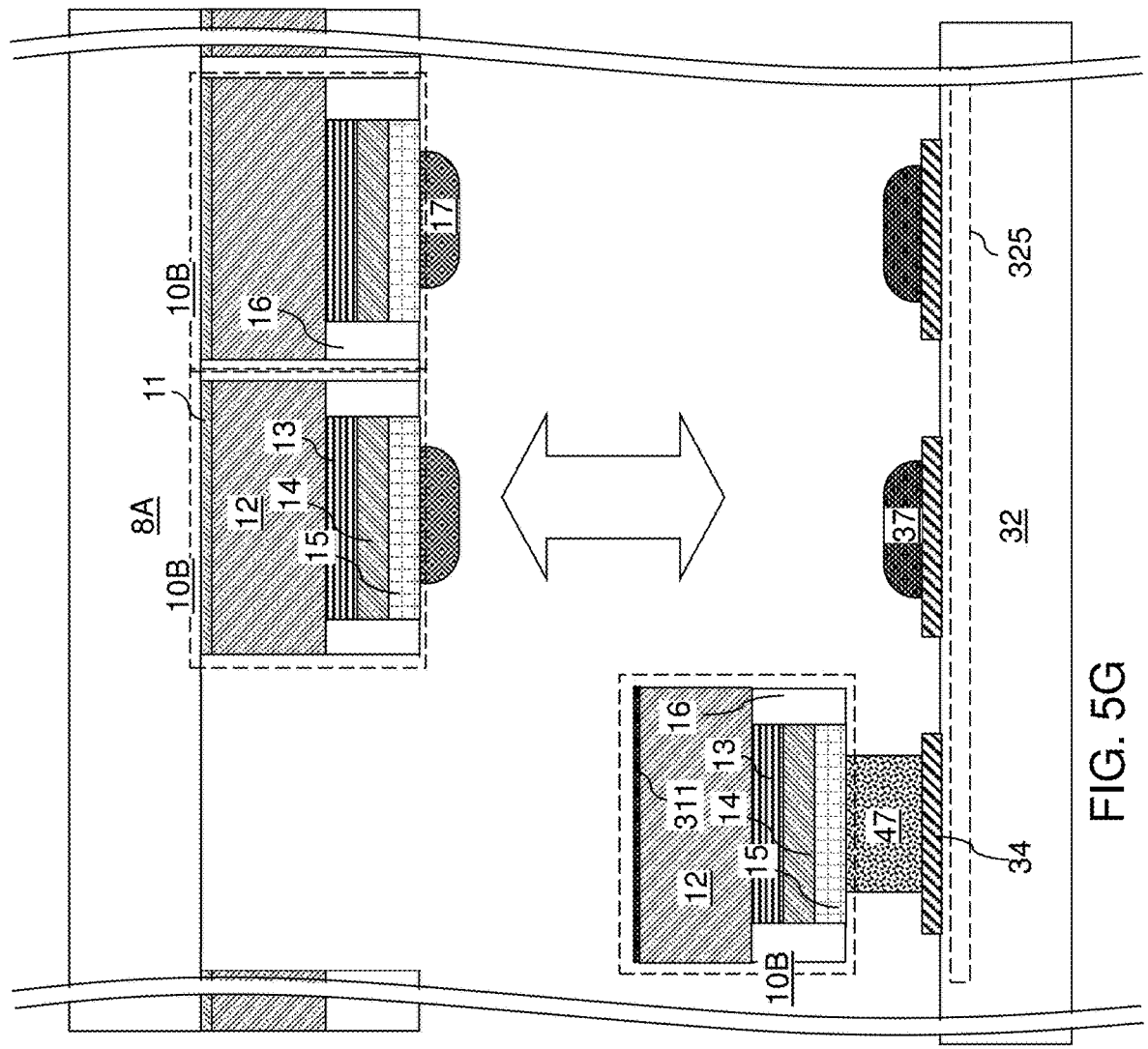

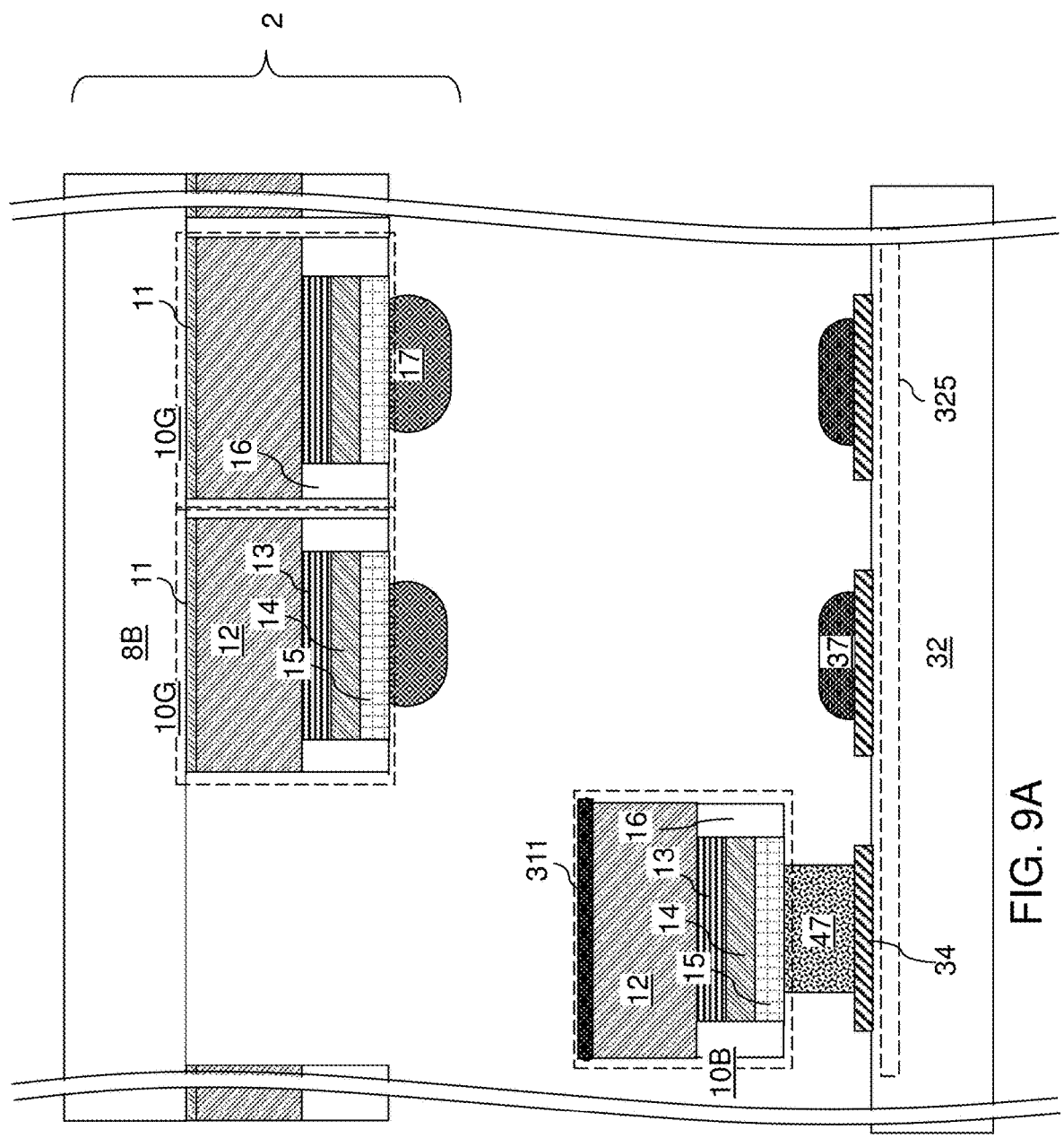

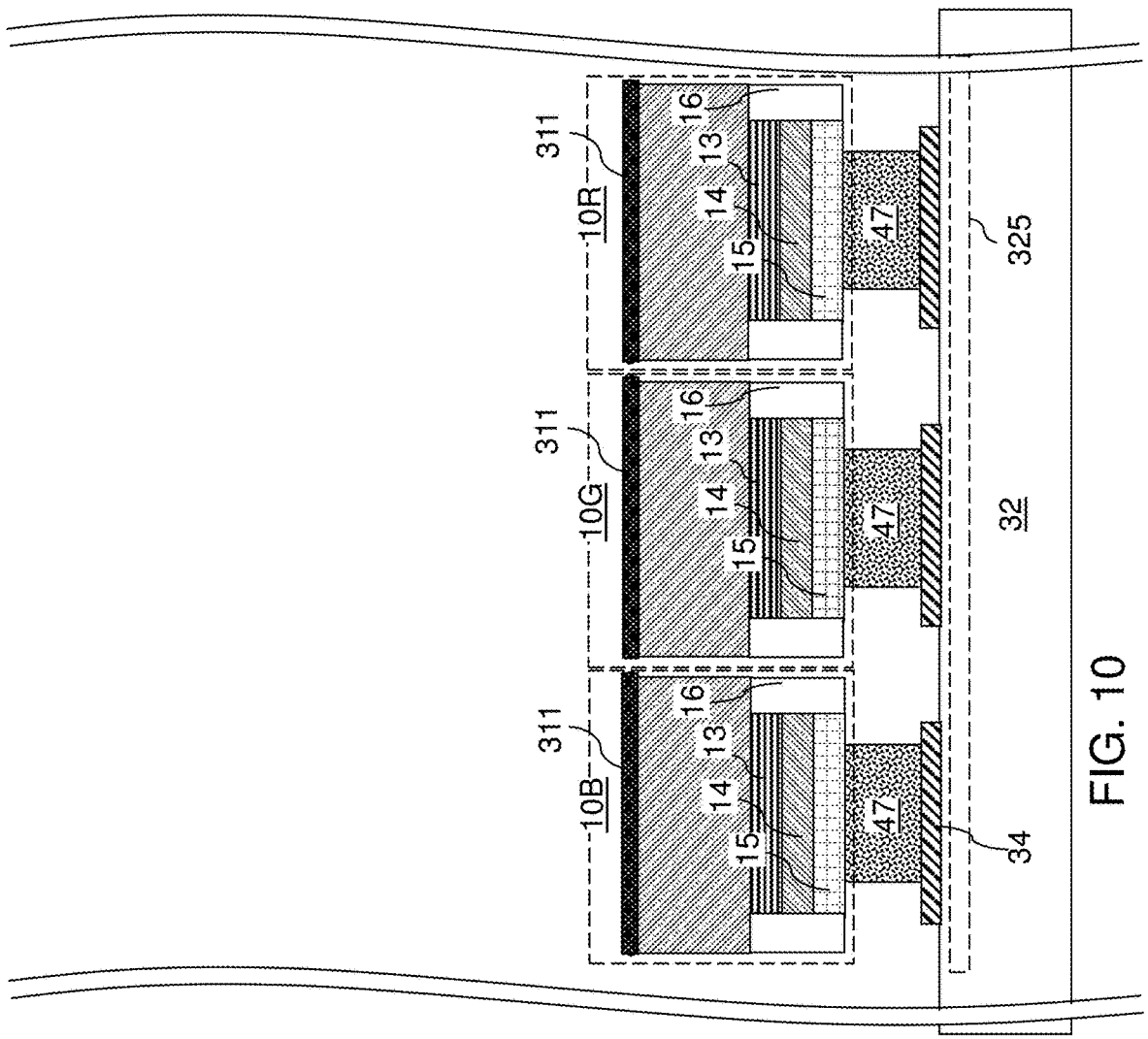

PARTIAL LASER LIFTOFF PROCESS DURING DIE TRANSFER AND STRUCTURES FORMED BY THE SAME

RELATED APPLICATION

This present application claims the benefit of priority from U.S. Provisional Patent Application Ser. No. 62/946,557, filed on Dec. 11, 2019 and the entire content of which is incorporated herein by reference.

FIELD

The embodiments of the invention are directed generally to a method of manufacturing semiconductor light emitting diodes, and specifically to a method of light emitting diode die transfer employing partial laser liftoff, and structures formed by the same.

BACKGROUND

Light emitting diodes (LEDs) are used in electronic displays, such as liquid crystal displays in laptops or LED televisions. However, it is challenging to attach different color LEDs to the same backplane of a display device with a high yield.

SUMMARY

According to an aspect of the present disclosure, a transfer method includes providing a first light emitting diode on a first substrate, performing a partial laser liftoff of the first light emitting diode from the first substrate, laser bonding the first light emitting diode to the backplane after performing the partial laser liftoff, and separating the first substrate from the first light emitting diode after the laser bonding.

According to yet another aspect of the present disclosure, a light emitting device assembly comprises a backplane with containing bonding pads, and first light emitting diodes attached to a first subset of the bonding pads through a respective bonding material portion. Each of the first light emitting diodes comprises a first conductivity type semiconductor layer, and a gallium-rich material portion located on a surface of the first conductivity type semiconductor layer and including gallium at an atomic concentration greater than 55%.

BRIEF DESCRIPTION OF THE DRAWINGS

FIG. 2 illustrates an exemplary transfer pattern and an exemplary transfer sequence for transferring four different types of devices from four transfer substrates to four backplanes.

FIG. 5A is a vertical cross-sectional view of a first exemplary structure including a backplane and a first source coupon containing first light emitting diodes located on a first substrate according to a first embodiment of the present disclosure.

FIG. 5G is a vertical cross-sectional view of the first exemplary structure after detaching a first assembly of the backplane and a first subset of the first light emitting diodes from a second assembly of the first substrate and a second subset of the first light emitting diodes according to the first embodiment of the present disclosure.

FIG. 9A is a vertical cross-sectional view of the second exemplary structure after aligning a second source coupon containing second light emitting diodes located on a second substrate to the first assembly according to the second embodiment of the present disclosure.

FIG. 10 is a vertical cross-sectional view of the second exemplary structure after transferring third light emitting diodes to the backplane according to the second embodiment of the present disclosure.

DETAILED DESCRIPTION

Figure 1:
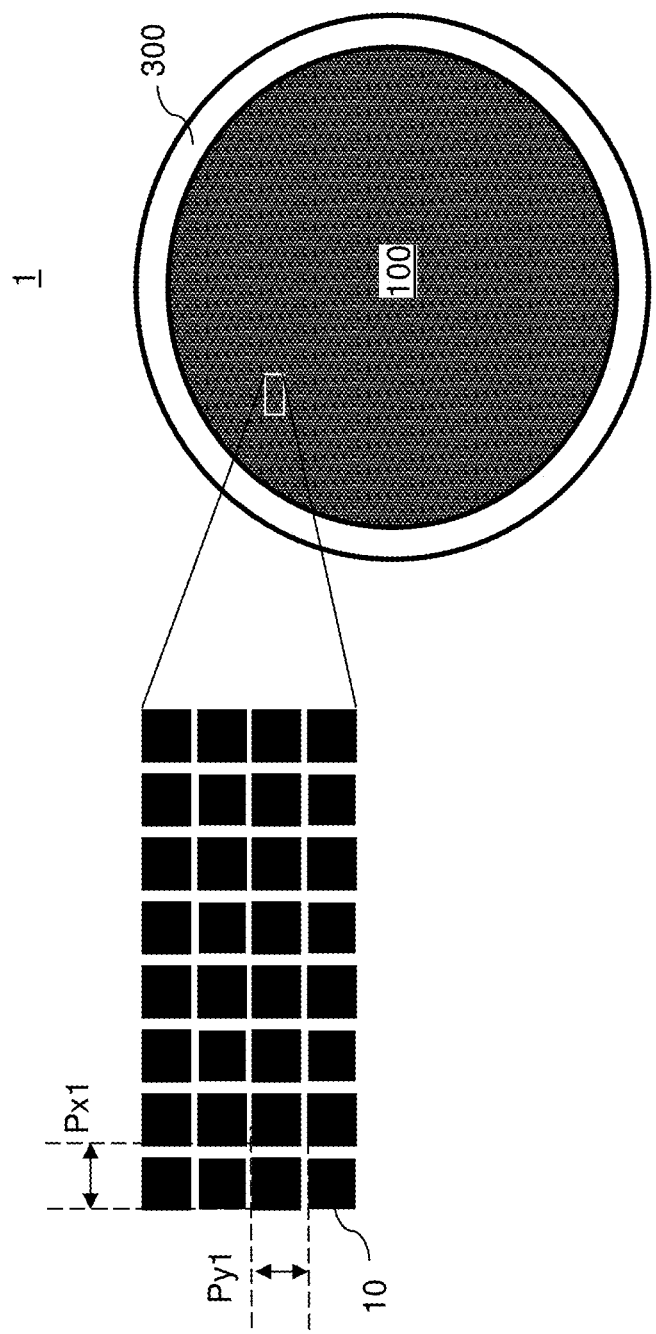
FIG. 1 schematically illustrates a substrate including dies of light emitting devices according to an embodiment of the present disclosure.
Figure 3A:
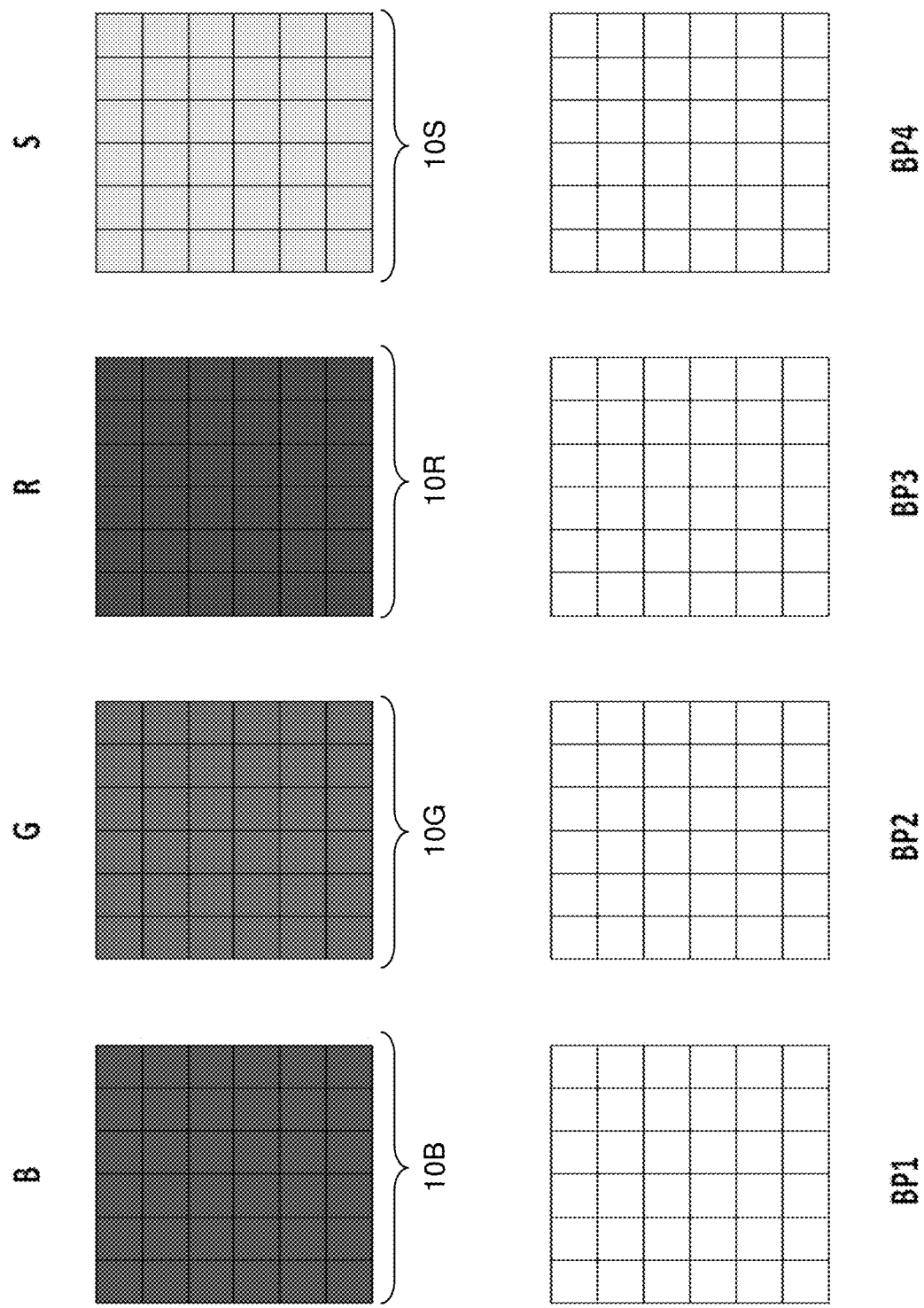
FIGS. 3A-3E are a schematic sequence for transfer of light emitting devices according to the exemplary transfer pattern illustrated in FIG. 2.
Figure 3B:
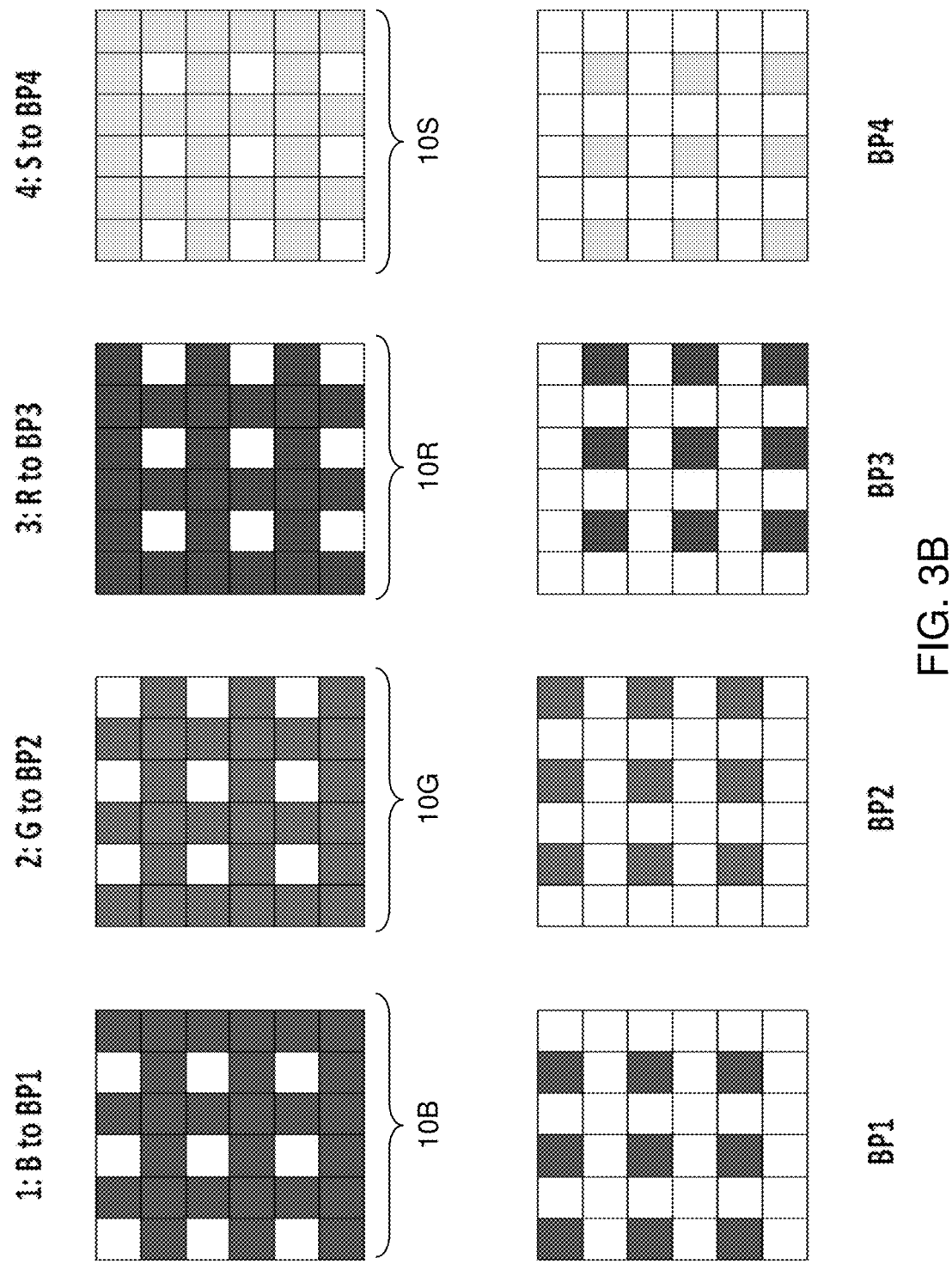
Figure 3C:
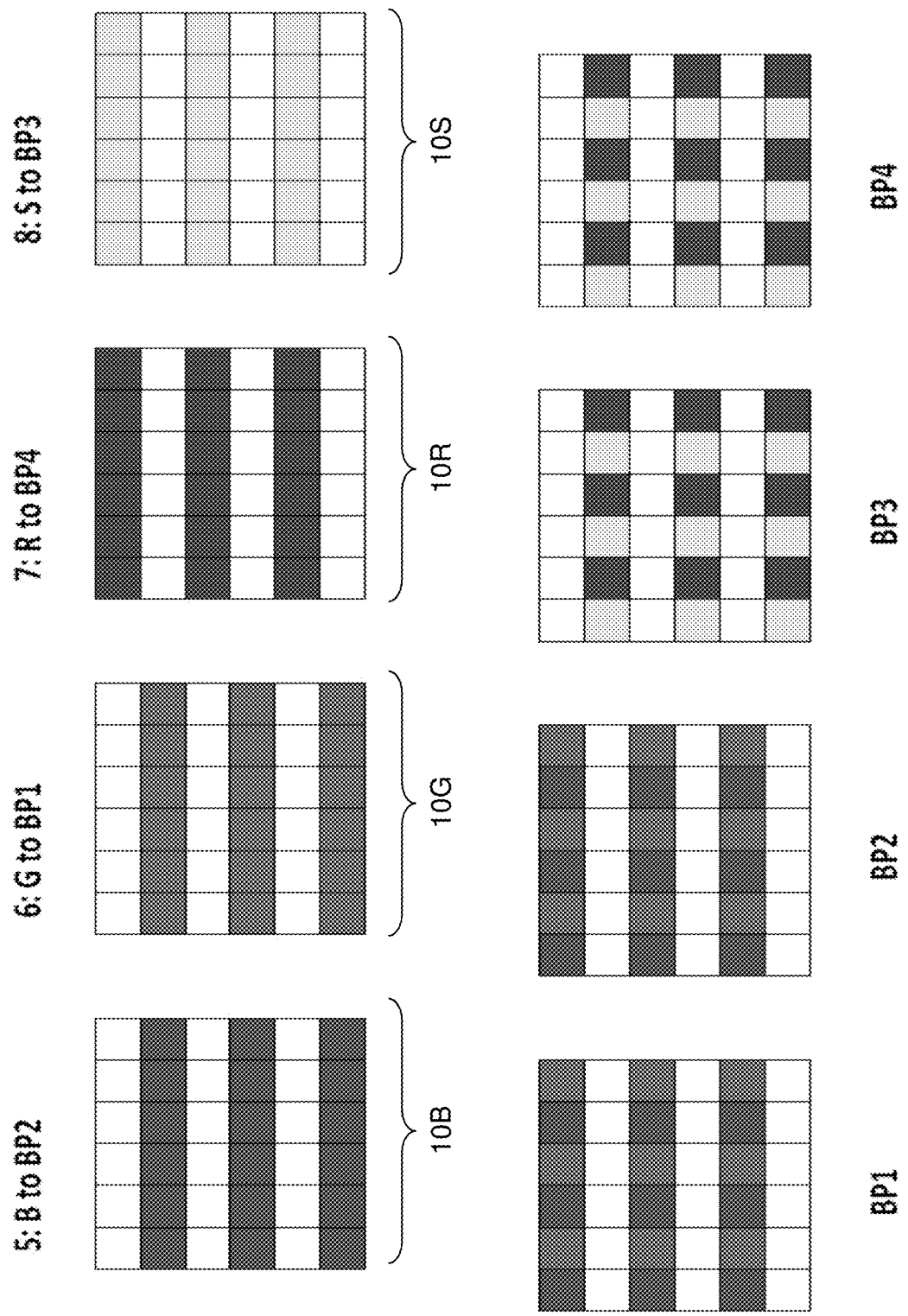
Figure 3D:
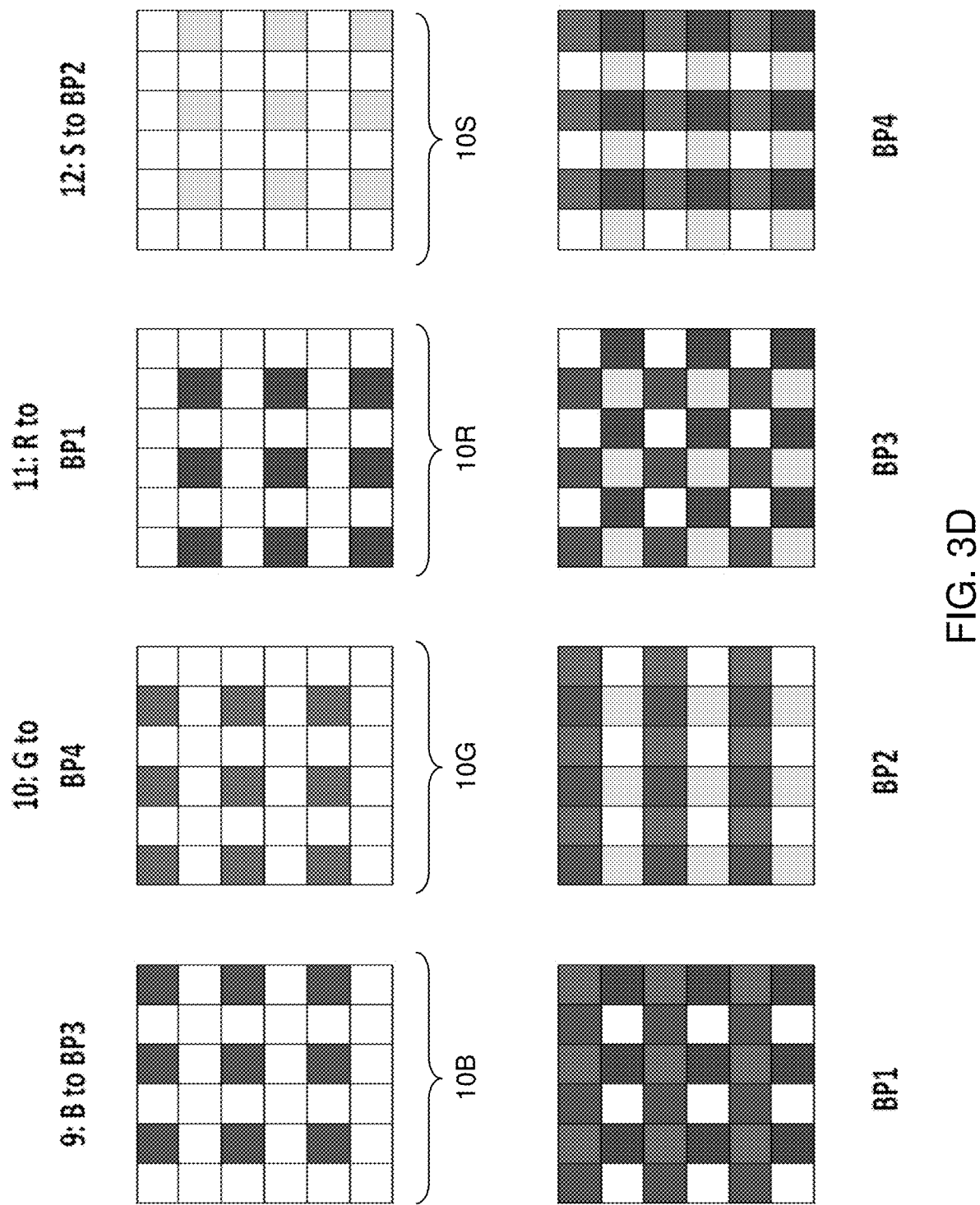
Figure 3E:
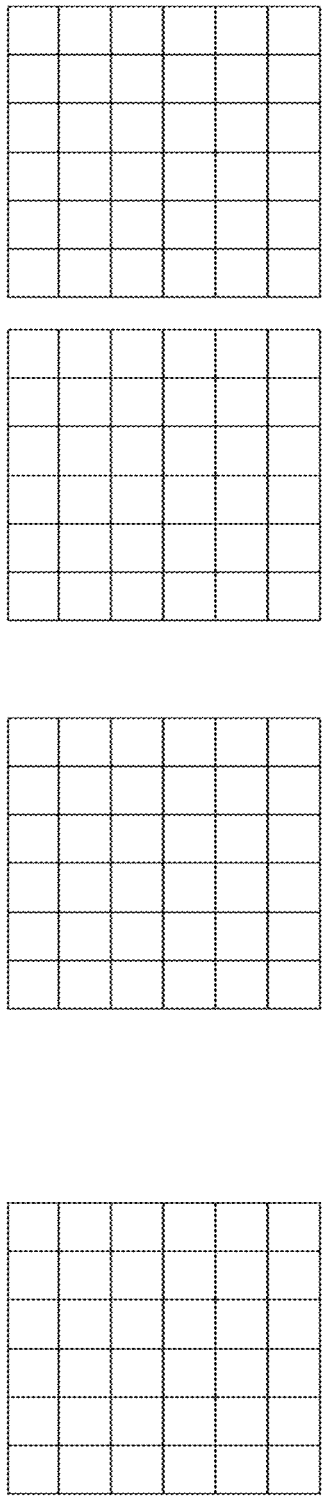
Figure 3E:
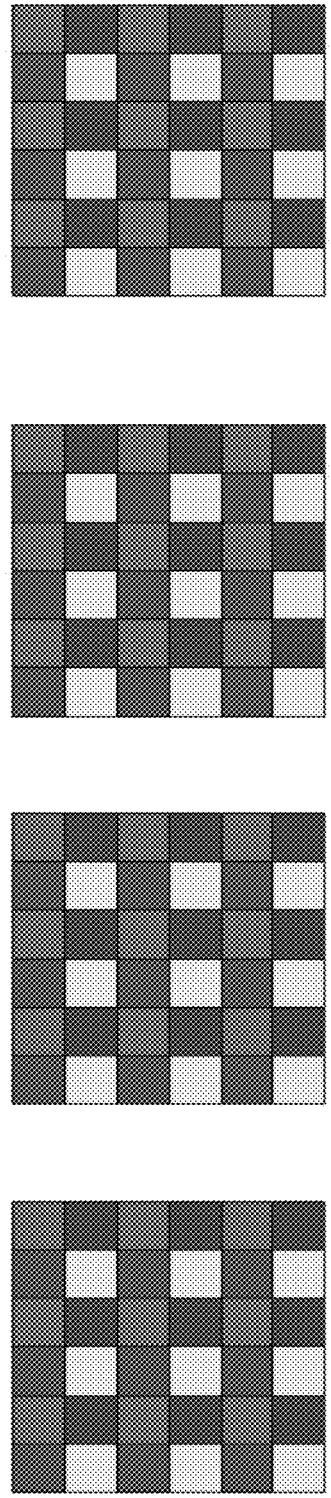

The embodiments of the present disclosure is directed to a method of manufacturing light emitting diodes, and specifically to a method of LED die transfer employing partial laser liftoff, and structures formed by the same, the various aspects of which are described below. Throughout the drawings, like elements are described by the same reference numeral. Elements with the same reference numeral are presumed to have a same material composition unless expressly stated otherwise. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

A light emitting diode may be a vertical structure (e.g., a vertical LED) in which the p-side and n-side contacts are located on opposite sides of the structure or a lateral structure in which the p-side and n-side contacts are located on the same side of the structure. As used herein, a "light emitting diode assembly" refers to an assembly in which at least one light emitting diode is structurally fixed with respect to a carrier structure, which can include, for example, a backplane or any other structure configured to provide stable mechanical support to the at least one light emitting diode.

In the embodiments of the present disclosure, a method is provided for transferring an array of light emitting diodes from a growth substrate to a target substrate, such as a backplane. In an illustrative example, the target substrate can be a backplane substrate such as an active or passive matrix backplane substrate for driving light emitting diodes. As used herein, a "backplane" or a "backplane substrate" refers to any substrate configured to affix multiple diodes thereupon. In one embodiment, the center-to-center spacing of neighboring light emitting diodes on the backplane substrate can be an integer multiple of the center-to-center spacing of neighboring light emitting diodes on the growth substrate. The light emitting diodes may include a plurality of light emitting diodes, such as a group of two light emitting diodes, one configured to emit blue light and one configured to emit green light. The light emitting diodes may include a group of three light emitting diodes, one configured to emit blue light, one configured to emit green light, and one configured to emit red light. As used herein, "neighboring light emitting diodes" refer to a plurality of two or more light emitting diodes located in closer proximity than at least another light emitting diode. The method of the present disclosure can provide selective transfer of a subset of light emitting diodes from a light emitting diode array on a growth substrate to the backplane substrate.

Diodes of a same type can be fabricated on respective initial growth substrates. As used herein, an "initial growth substrate" refers to a substrate that is processed to form devices thereupon or therein. The devices can include light emitting diodes and/or sensor devices (e.g., photodetectors) and/or any other electronic devices. The light emitting diodes can be any type of light emitting diodes, i.e., vertical light emitting diodes, lateral light emitting diodes, or any combination thereof. Diodes of the same type can be formed on each initial growth substrate, the types being different from one initial growth substrate to another. The diodes can be formed as an array on the respective initial growth substrates.

Referring to FIG. 1, a first source coupon 1 containing a growth substrate including dies of light emitting diodes 10 is illustrated. The substrate may include an edge exclusion region 300 at a periphery, in which diodes are not formed. The substrate can include light emitting diodes of a same type (which is herein referred to as first type) arranged in a first array configuration. The light emitting diodes of the first type are multiple instances of the same diode, which may be, for example, light emitting diodes that emit light at a same peak wavelength. For example, the light emitting diodes of the first type may be red light emitting diodes, green light emitting diodes, or blue light emitting diodes.

The first array configuration has a primary-direction pitch $Px1$ along a respective primary direction (i.e., the primary direction of the first array configuration) and has a secondary-direction pitch $Py1$ along a respective secondary direction (i.e., the secondary direction of the first array configuration). As used herein, a primary direction and a second direction of an array configuration refer to two directions along which a unit cell of the array configuration is repeated. In a rectangular array configuration, the primary direction and the second direction may be perpendicular to each other, and are referred to as an x-direction and a y-direction.

The light emitting diodes 10 on the substrate can be transferred to multiple backplanes having bonding sites in the second array configuration. A predetermined transfer pattern and a predetermined transfer sequence can be employed for transfer of the light emitting diodes 10. Light emitting diodes of different types provided different substrates can be employed in conjunction with the light emitting diodes 10 from the substrate to provide a functional direct view light emitting diode assembly.

Figure 2:
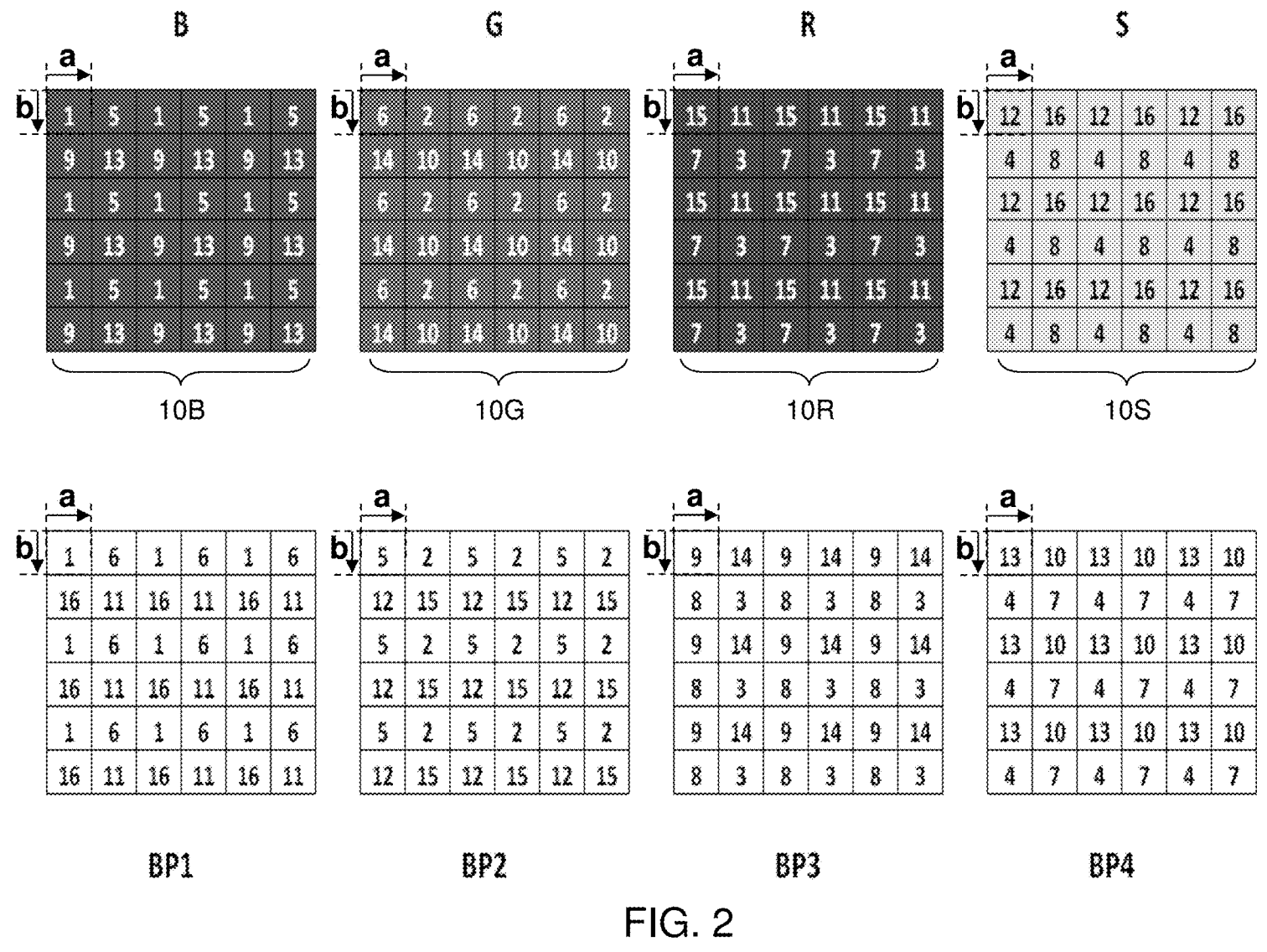

Referring to FIG. 2, an exemplary transfer pattern and an exemplary transfer sequence are illustrated for transferring four different types of devices (10B, 10G, 10R, 10S) (e.g., blue, green and red emitting LEDs and optional sensors, respectively) to four backplanes (BP1, BP2, BP3, BP4). The four different types of devices (10B, 10G, 10R, 10S) can be provided on four source substrates (B, G, R, S), which can comprise four transfer substrates, four growth substrates, or combinations thereof. The first light emitting diodes 10B can be provided on the first source substrate B, the second light emitting diodes 10G can be provided on the second source substrate G, the third light emitting diodes 10R can be provided on the third source substrate R, and the sensors 10S can be provided on the fourth source substrate S.

A subset of first light emitting diodes 10B labeled "1" can be transferred from the first source substrate B to locations on the first backplane BP1 that are marked with "1." Subsequently, a subset of second diodes 10G labeled "2" can be transferred from the second source substrate G to a second substrate BP2 to locations on the second backplane BP2 that are marked with "2." The sequential transfer continues with each set of diodes labeled with gradually increasing numerical indices up to the set of diodes labeled with the numerical index "16."

While the exemplary transfer pattern and the exemplary transfer sequence is illustrated for cases in which four source substrates (B, G, R, S) and four backplanes (BP1, BP2, BP3, BP4) are employed, the method of the present disclosure can be applied to any case in which m transfer assemblies and n backplanes are employed, in which m is an integer greater than 1, n is an integer greater than 1, and n is not less than m. The n backplanes bond with diodes from the m transfer assemblies to form n integrated light emitting diode assemblies. In one embodiment, n can be the same as, or greater than, m.

A plurality of transfer assemblies, e.g., m transfer assemblies, is provided. Each of the m transfer assemblies comprises a respective source substrate (B, G, R, S) and respective devices (10B, 10G, 10R, 10S) within a two-dimensional array having a same two-dimensional periodicity. As used herein, a same two-dimensional periodicity for multiple structures refers to a configuration in which each of the multiple structures has a respective unit structure and instances of the respective unit structure are repeated along two independent directions of periodicity (e.g., a first periodicity direction and a second periodicity direction), and the unit structures are repeated along the respective first periodicity direction with a same first pitch and are repeated along the respective second periodicity direction with a same second pitch for all of the multiple structures, and the angle between the first periodicity direction and the second periodicity direction is the same for all of the multiple structures. Each of the n backplanes has a periodic repetition of respective unit bonding material portions pattern configured to mount m types of diodes.

Each of the m types of devices can be one of the devices within a respective transfer assembly among the m transfer assemblies. The pitches of each unit bonding material portions pattern along two independent directions within each of the n backplanes can be multiples of a respective pitch of the two-dimensional periodicity of the devices within each of the m transfer assemblies. In an illustrative example, each of the devices (10B, 10G, 10R, 10S) can be periodic within a respective transfer assembly with the first periodicity of a along a first direction, and with the second periodicity of b along a second direction (which may be perpendicular to the first direction). The unit conductive bond pad pattern within each of the backplanes can have the first periodicity of 2a (which is an integer multiple of a) along a first direction, and with the second periodicity of 2b (which is an integer multiple of b) along a second direction (which may be perpendicular to the first direction).

Subsets of devices (10B, 10G, 10R, 10S) from each of the m transfer assemblies can be sequentially transferred to a respective backplane (BP1, BP2, BP3, BP4) among the n backplanes by disposing each respective transfer assembly over the respective backplane (BP1, BP2, BP3, BP4) at locations that preclude collision of existing devices on the respective transfer assembly with any devices (10B, 10G, 10R, 10S), if any, that are previously bonded to the respective backplane (BP1, BP2, BP3, BP4).

Figure 4:
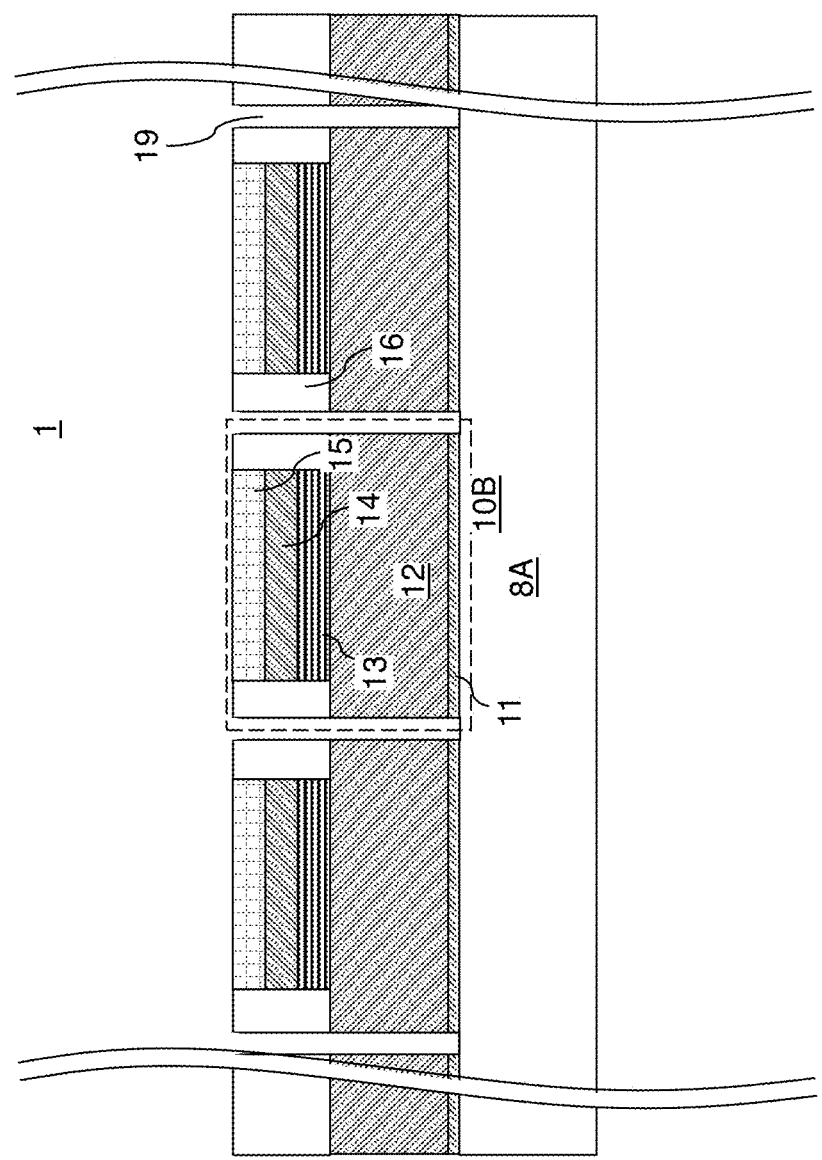
FIG. 4 is a vertical cross-sectional view of a source coupon including light emitting diodes located on a source substrate according to an embodiment of the present disclosure.

Referring to FIG. 4, the first source coupon 1 is illustrated, which includes a first substrate 8A (which is also referred to as a first growth substrate or a first source substrate) and first light emitting diodes 10B located on the first substrate 8A. The first substrate 8A may be any suitable substrate on which LED layers may be grown, such as a single crystalline substrate on which LED semiconductor layers can be grown. For example, the first substrate 8A may be a sapphire substrate.

Each first light emitting diode 10B includes a buffer layer 11 and a first conductivity type semiconductor layer 12. Each buffer layer 11 is an amorphous III-V compound semiconductor layer that includes gallium and nitrogen. Each first conductivity type semiconductor layer 12 is a crystalline III-V compound semiconductor material layer that includes gallium and nitrogen. For example, the buffer layer may include amorphous gallium nitride (GaN), indium gallium nitride (InGaN), aluminum gallium nitride (AlGaN) or aluminum indium gallium nitride (AlInGaN), while the first conductivity type semiconductor layer 12 may include single crystalline or polycrystalline GaN, InGaN, AlGaN or AlInGaN. The first conductivity type semiconductor layer 12 has conductivity of the first type, which may be n-type or p-type. For example, the first conductivity type semiconductor layer 12 comprises an n-type semiconductor layer. The buffer layer 11 may be undoped or may also have the first conductivity type.

The buffer layer 11 is located between the first conductivity type semiconductor layer 12 and the first substrate 8A. The buffer layer 11 may have the same material composition as the first conductivity type semiconductor layer 12. For example, the buffer layer 11 and the first conductivity type semiconductor layer 12 may both comprise gallium nitride. The amorphous gallium nitride buffer layer 11 may be formed during the initial deposition of crystalline gallium nitride first conductivity type semiconductor layer 12 on patterned sapphire substrate (PSS) 8A, where the gallium nitride growth conditions transition from the amorphous to crystalline gallium nitride layer growth. The thickness of the buffer layer 11 can be in a range from 100 nm to 400 nm, such as from 150 nm to 300 nm, although lesser and greater thicknesses can also be employed. The thickness of the first conductivity type semiconductor layer 12 can be from 500 nm to 5 microns, such as 1 to 3 microns, although lesser and greater thicknesses can also be employed.

An active layer 13 is located over the first conductivity type semiconductor layer 12. In one embodiment, the active layer 13 may comprise at least one bulk, quasi-bulk or quantum well layer selected from GaN, InGaN, AlGaN and/or AlInGaN. For example, the active layer may comprise a stack of one or more InGaN quantum well layers between respective GaN and/or AlGaN barrier layers. Generally, any light emitting layer stack known in the art can be employed for the active layer 13.

A second conductivity type semiconductor layer 14 is located over the active layer. The second conductivity type semiconductor layer 14 has a doping of a second conductivity type. The second conductivity type is the opposite of the first conductivity type. If the first conductivity type is n-type, then the second conductivity type is p-type, and vice versa. In one embodiment, the first conductivity type is n-type, and the second conductivity type is p-type. Each second conductivity type semiconductor layer 14 may comprise a crystalline (e.g., single crystalline or polycrystalline)

GaN, InGaN, AlGaN and/or AlInGaN layer. Thus, the active layer 13 is located between the first and second conductivity type layers.

A contact-level material layer 15 is located over the second conductivity type layer 14. The contact-level material layer 15 comprises at least one electrically conductive layer which functions as an electrode (e.g., p-type side electrode). The contact-level material layer 15 can include a layer stack including, from bottom to top, a transparent conductive oxide layer, a reflector layer and/or a bonding pad material layer. The transparent conductive oxide layer includes a transparent conductive oxide material such as indium tin oxide or aluminum doped zinc oxide. The reflector layer includes gold, silver and/or aluminum. The bonding pad material layer includes a metallic material that can function as a bonding pad, such as gold, copper, nickel, titanium, titanium nitride, tungsten, tungsten nitride, another metal having a higher melting point than a solder material to be subsequently employed, alloys thereof, and/or layer stacks thereof.

The stack of second conductivity type semiconductor layer 14, active layer 13, and optionally the first conductivity type semiconductor layer 12 within each first light emitting diode 10B may be patterned employing various patterning methods to form grooves 19 between adjacent LEDs 10B. A dielectric matrix layer 16 can be formed between the first LEDs 10B. The grooves 19 define the area of each first LED 10B. Specifically, each continuous set of patterned material layers overlying the first substrate 8A and laterally enclosed by a set of grooves 19 constitutes a first light emitting diode 10B. In one embodiment, the grooves 19 can be formed in a lattice pattern to provide an array of first light emitting diodes 10B, which may be a periodic array of first light emitting diodes 10B. The first light emitting diodes 10B can emit light at a first peak wavelength, such as a blue light having the first peak wavelength in the blue spectral range.

While FIG. 4 illustrates a specific embodiment of first light emitting diodes 10B, embodiments of the present disclosure can be utilized employing any configuration for first light emitting diodes 10B provided that a structure for attaching a bonding material portion is provided on a side of each first light emitting diode 10B that faces away from the first substrate 8A.

Referring to FIG. 5A, a diode-side bonding material portion 17 can be attached to the contact-level material layer 15 in each of the first light emitting diodes 10B. In one embodiment, the diode-side bonding material portions 17 can be solder material portions such as pure tin or an alloy of tin and indium.

A backplane 32 is provided. The backplane 32 includes a substrate and a metal interconnect layer 325 formed on a front side surface of the substrate. In one embodiment, the substrate can include a plastic (e.g., polymer) substrate. In one embodiment, the metal interconnect layer 325 can include a plurality of metal interconnect structures located on the surface of the substrate and/or embedded in at least one insulating material and providing electrical connections between the light emitting diodes to be bonded onto the backplane 32 and input/output pins of the backplane 32.

Bonding pads 34 can be provided on a surface of the backplane 32 that overlies the metal interconnect layer 325. In one embodiment, the bonding pads 34 can be arranged as a two-dimensional periodic array or as a one-dimensional periodic array. The bonding pads 34 include a bonding pad material such as gold, copper, nickel, titanium, titanium nitride, tungsten, tungsten nitride, another metal having a higher melting point than a solder material to be subsequently employed, alloys thereof, and/or layer stacks thereof.

A backplane-side bonding material portion 37 can be attached to the bonding pads 34. In one embodiment, the backplane-side bonding material portions 37 can be solder material portions such as pure tin or alloy of tin and indium.

The first source coupon 1 and the backplane 32 can be aligned such that a pair of a diode-side bonding material portion 17 and a backplane-side bonding material portion 37 face each other at every lattice point of the periodic array of the bonding pads 34.

Figure 5B:
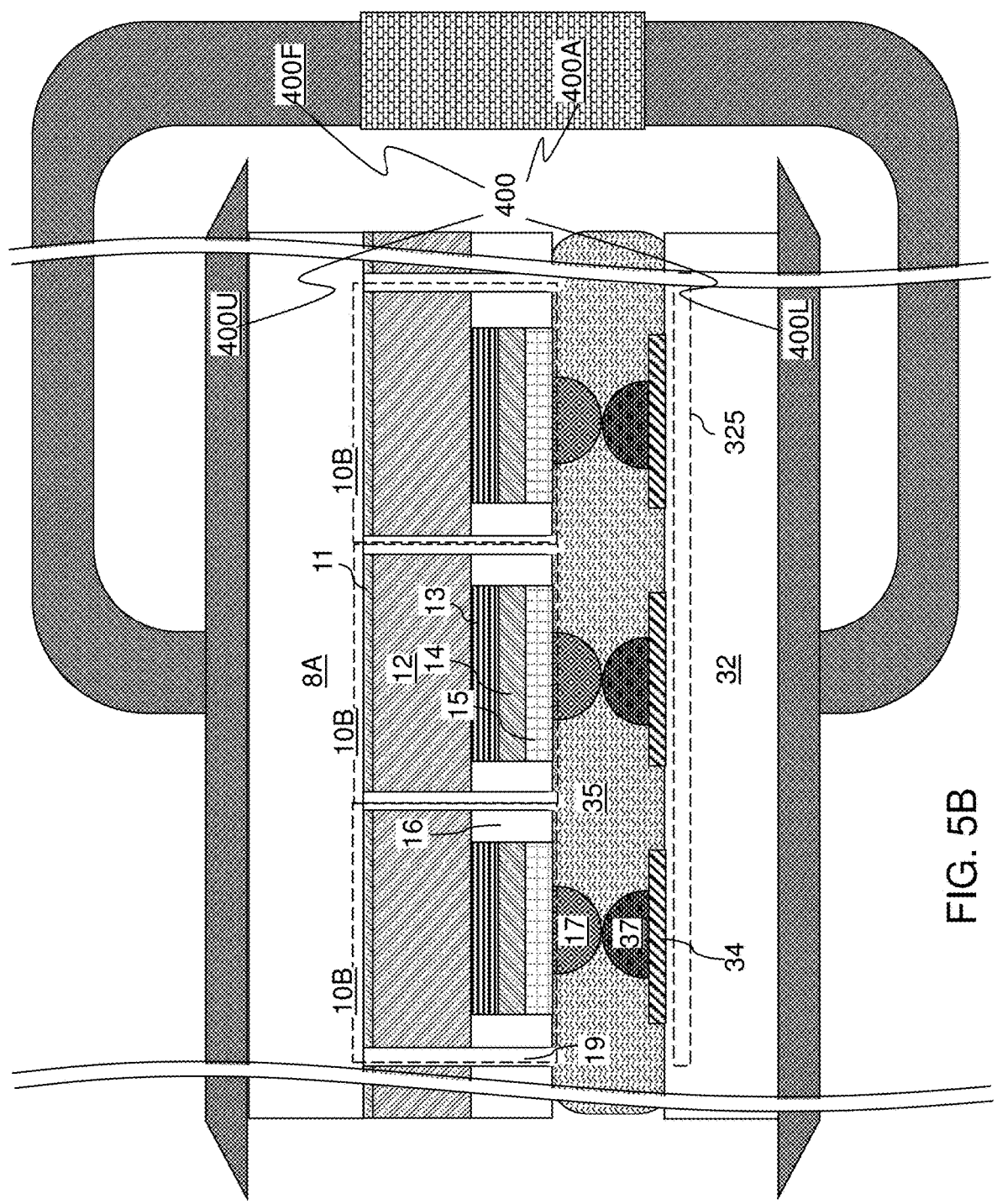
FIG. 5B is a vertical cross-sectional view of the first exemplary structure after aligning and clamping the backplane and the first source coupon according to the first embodiment of the present disclosure.

Referring to FIG. 5B, the backplane 32 and the first source coupon 1 are brought into contact with each other such that each facing pair of a diode-side bonding material portion 17 and a backplane-side bonding material portion 37 contact each other. Each of the diode-side bonding material portion 17 can have an areal overlap with a respective underlying backplane-side bonding material portion 37. In one embodiment, the area of the overlap may be at least 70%, such as more than 80% and/or more than 90%, of the area of the diode-side bonding material portion 17. In one embodiment, the geometrical center of each diode-side bonding material portion 17 can overlie a geometrical center of an underlying backplane-side bonding material portion 37.

Generally, at least one bonding material portion (17, 37) can be disposed between each vertically neighboring pair of a respective one of the bonding pads 34 and a respective one of the first light emitting diodes 10B. In one embodiment, a pair of a diode-side bonding material portion 17 and a backplane-side bonding material portion 37 can be provided between each vertically neighboring pair of a respective one of the bonding pads 34 and a respective one of the first light emitting diodes 10B. In one embodiment, the diode-side bonding material portions 17 may be omitted. In another embodiment, the backplane-side bonding material portions 37 may be omitted.

In one embodiment, a solder flux 35 may be applied between the backplane 32 and the first light emitting diodes 10B such that the solder flux 35 laterally surrounds each bonding material portion (17, 37). The solder flux 35 may be any suitable liquid flux which reacts with tin oxide to leave metallic tin bonding material portions (17, 37). In one embodiment, a fixture, such as a clamp 400, may be employed to hold the assembly of the backplane 32 and the first source coupon 1 in place without lateral slippage. In an illustrative example, the clamp 400 may include an upper plate 400U that presses against the backside of one of the backplane 32 or the first source coupon 1, a lower plate 400L that presses against the backside of the other of the backplane 32 or the first source coupon 1, a frame 400F that includes mechanical support elements that holds the upper plate 400U and the lower plate 400L in place, and an adjustment unit 400A that adjusts the force applied to the upper plate 400U and/or to the lower plate 400L or adjusts the distance between the upper plate 400U and the lower plate 400L. The plate contacting the first source coupon 1, such as the upper plate 400U may include material transparent to UV, visible light or IR laser radiation and/or it may include a central opening such that laser beams can pass through it, while the upper plate 400U clamps only the edge of the first source coupon 1.

In an illustrative example, the backplane 32 and the first source coupon 1 can be held in place while a compressive force is applied to the assembly of the backplane 32, the bonding material portions (17, 37), and the first source coupon 1 along the vertical direction. The magnitude of the compressive force can be selected such that the bonding material portions (17, 37) are not deformed in a significant manner, i.e., the bonding material portions (17, 37) maintain the shapes as provided prior to clamping, and without bonding the respective bonding material portions 17 and 37 to each other. In an illustrative example, if 100,000 pairs of a diode-side bonding material portion 17 and a backplane-side bonding material portion 37 are present between the backplane 32 and the first source coupon 1, then the magnitude of the compressive force applied by the clamp 400 may be in a range from 250 N to 400 N.

Figure 5C:
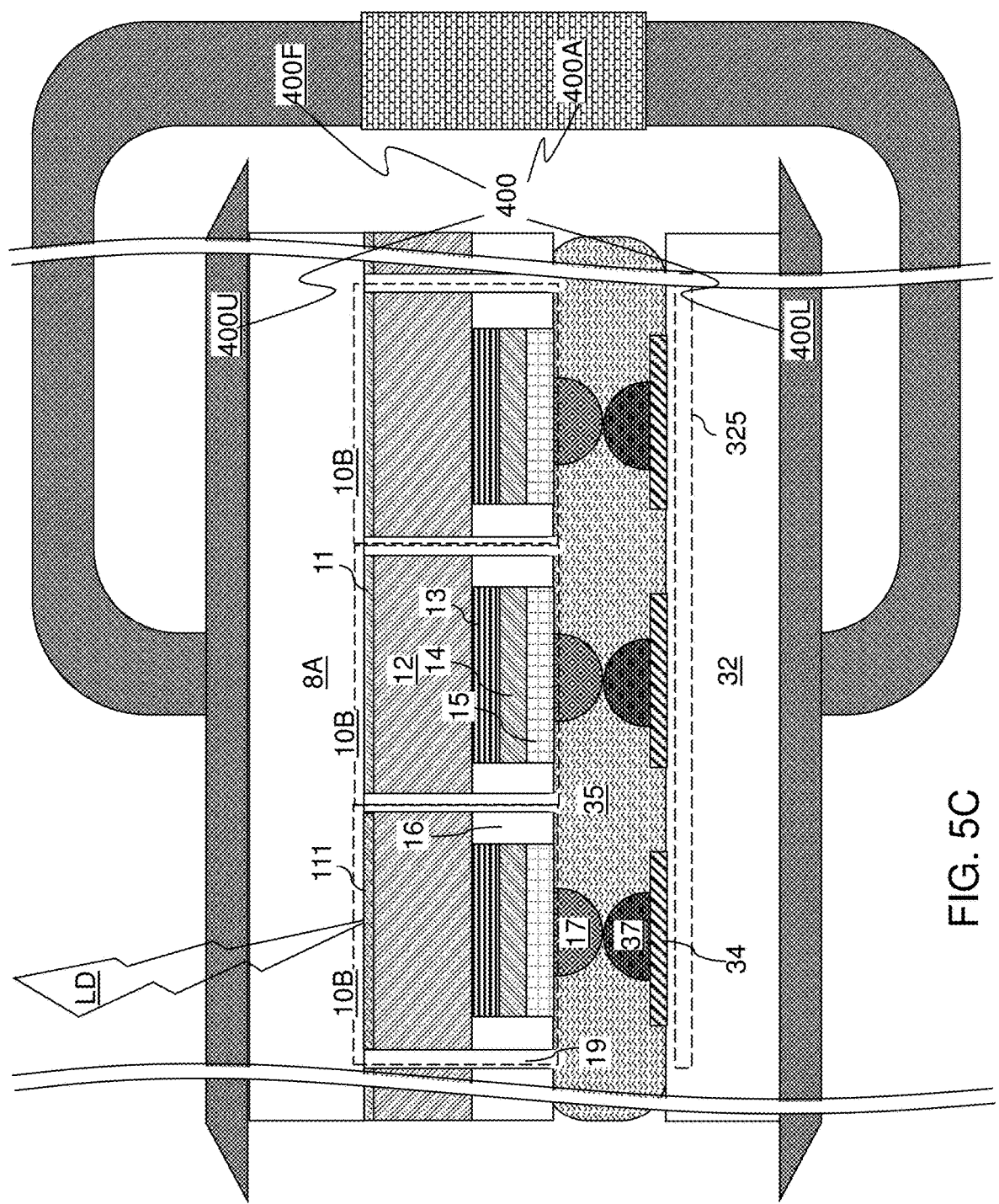
FIG. 5C is a vertical cross-sectional view of the first exemplary structure after a detachment laser irradiation according to the first embodiment of the present disclosure.

Referring to FIG. 5C, a sequential laser irradiation process can be performed to selectively irradiate each buffer layer 11 that overlies a first light emitting diode 10B to be subsequently transferred to the backplane 32 with a detachment laser beam LD. The set of all first light emitting diodes 10B that are subsequently transferred to the backplane 32 is herein referred to as a first subset of the first light emitting diodes 10B. The detachment laser beam LD performs a partial laser liftoff process used to partially lift off the first subset of the first light emitting diodes 10B, and is herein referred to as a detachment laser irradiation process. Each buffer layer 11 of the first subset of the first light emitting diodes 10B is sequentially irradiated with the detachment laser beam LD one by one. The lateral dimension (such as a diameter) of the detachment laser beam LD can be about the same as the lateral dimension of a first light emitting diode 10B. Thus, each buffer layer 11 can be individually irradiated without causing significant compositional changes in neighboring buffer layers 11.

The detachment laser beam LD can have an ultraviolet wavelength or a wavelength in a visible light range, and may be absorbed by the gallium and nitrogen containing III-V compound semiconductor material of the irradiated buffer layers 11. Without wishing to be bound by a particular theory, it is believed that irradiation of the detachment laser beam LD onto a buffer layer 11 evaporates nitrogen atoms without evaporating, or with minimal evaporation of, gallium atoms. The irradiation thus reduces the atomic percentage of nitrogen in a remaining material. The first source coupon 1 and the backplane 32 can be mechanically held in place by the clamp 400 during and after this step.

In one embodiment, and without being bound by a particular theory, it is believed that the irradiated subset of the buffer layers 11 within the first subset of the first light emitting diodes 10B may be converted into gallium-rich drops 111. The gallium-rich drops 111 may consist of pure liquid gallium-rich drops or may include an alloy of gallium and nitrogen containing gallium at an atomic concentration greater than 55%, such as 60% to 99%.

Figure 5D:
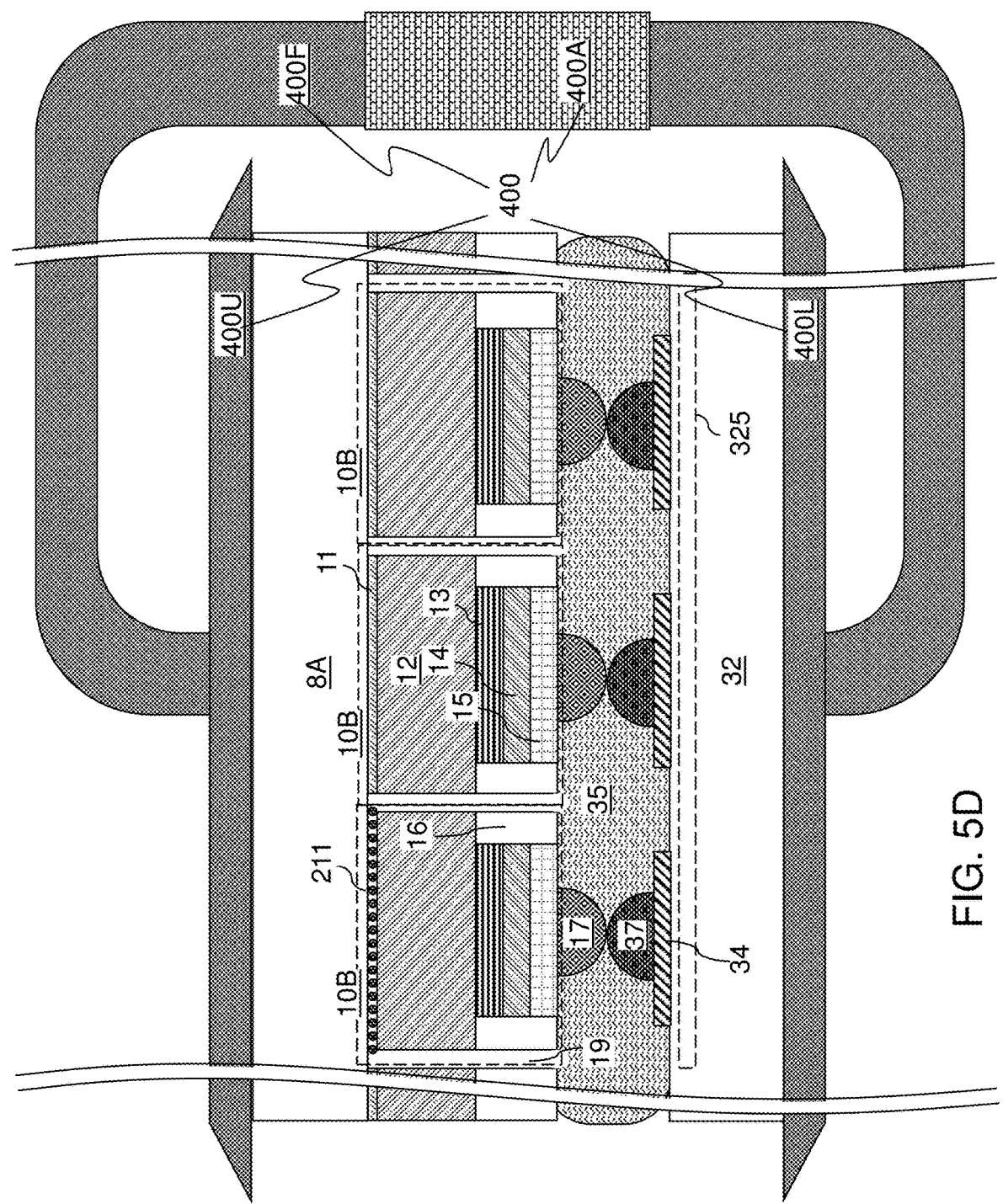
FIG. 5D is a vertical cross-sectional view of the first exemplary structure after a cooling step according to the first embodiment of the present disclosure.

As shown in FIG. 5D, the liquid gallium-rich drops 111 may solidify into solid gallium-rich material portions (e.g., pure gallium or gallium rich alloy particles or regions) 211 after the irradiation if the first source coupon 1 temperature is maintained below the melting temperature of gallium (e.g., 29.76° C.) or its alloy. In one embodiment, each remaining portion of the laser-irradiated buffer layer 11 (which is a subset of the buffer layers 11 within the first subset of the first light emitting diodes 10B) may include gallium-rich material portions 211 (i.e., solid pure gallium or gallium rich alloy particles or regions). In one embodiment, the gallium-rich material portions 211 can include gallium atoms at an atomic concentration greater than 55%, such as 60% to 100%. The gallium-rich material portions 211 can have an average thickness in a range from 5 nm to 100 nm, such as from 10 nm to 50 nm, although lesser and greater thicknesses can also be employed. Each gallium-rich material portion 211 may comprise a continuous material layer, or may comprise a cluster of ball-shaped material portions. The subset of the buffer layers 11 located within the second subset of the first light emitting diodes 10B that are not subsequently transferred to the backplane 32 are not irradiated with the laser beam LD, and thus, remain as buffer layers 11, such as gallium nitride buffer layers having about 50 atomic percent gallium and thus a higher melting point than the gallium-rich material portions 211.

Since a backplane-side bonding material portion 37 and a diode-side bonding material portion 17 within each adjoining pair merely contact each other during the laser irradiation and are not bonded to each other, the mechanical shock from the laser irradiation is not transmitted to the backplane 32 that can include a relatively fragile polymer. Thus, the partial laser liftoff described above with respect to FIGS. 5C and 5D which forms the gallium-rich material portions 211 may cause little or no damage to the backplane 32 and to the electrically conductive elements (34, 325) on the backplane 32. Further, the partial laser liftoff process prevents damage to re-solidified bonding material portions in subsequent processing steps, such as the processing steps of FIG. 5F, because the bonding reflow happens after the partial laser liftoff.

Figure 5E:
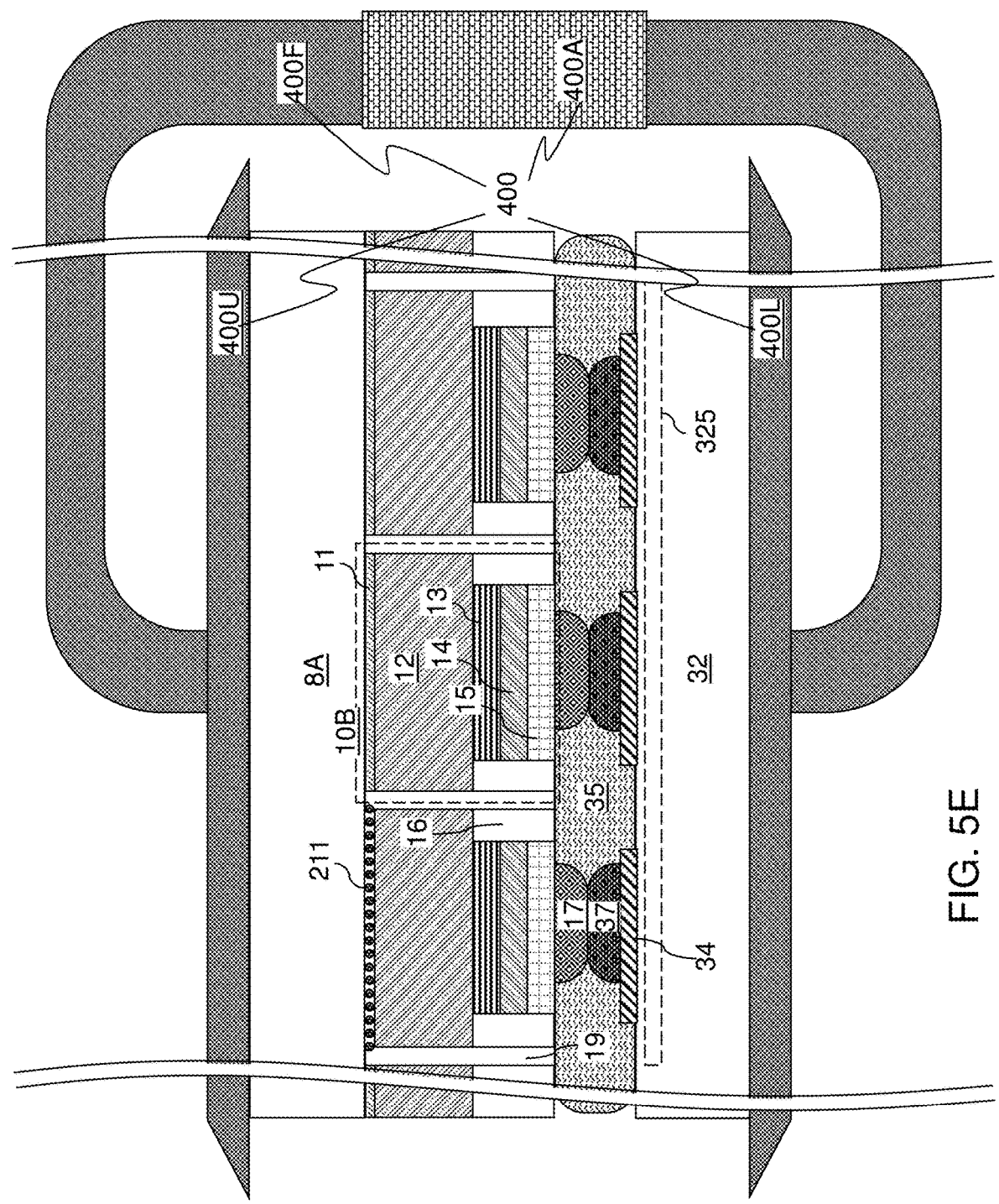
FIG. 5E is a vertical cross-sectional view of the first exemplary structure after pressing the backplane and the first source coupon against each other according to the first embodiment of the present disclosure.

Referring to FIG. 5E, the backplane 32 and the first source coupon 1 can be pressed against each other with a greater force to induce deformation of the bonding material portions (17, 37) (i.e., to coin the bonding material portions to smooth out any rough bonding surfaces). Thus, each mating pair of a respective diode-side bonding material portion 17 and a respective backplane-side bonding material portion 37 can be pressed against each other at a second pressure that is greater than the first pressure after conversion of the subset of the buffer layers 11 into the gallium-rich material portions 211. The second pressure is sufficient to form deformation of the diode-side bonding material portions 17 and the backplane-side bonding material portions 37. In an illustrative example, if 100,000 pairs of a diode-side bonding material portion 17 and a backplane-side bonding material portion 37 are present between the backplane 32 and the first source coupon 1, then a magnitude of the compressive force applied by the clamp 400 may be in a range from 500 N to 1,000 N.

Figure 5F:
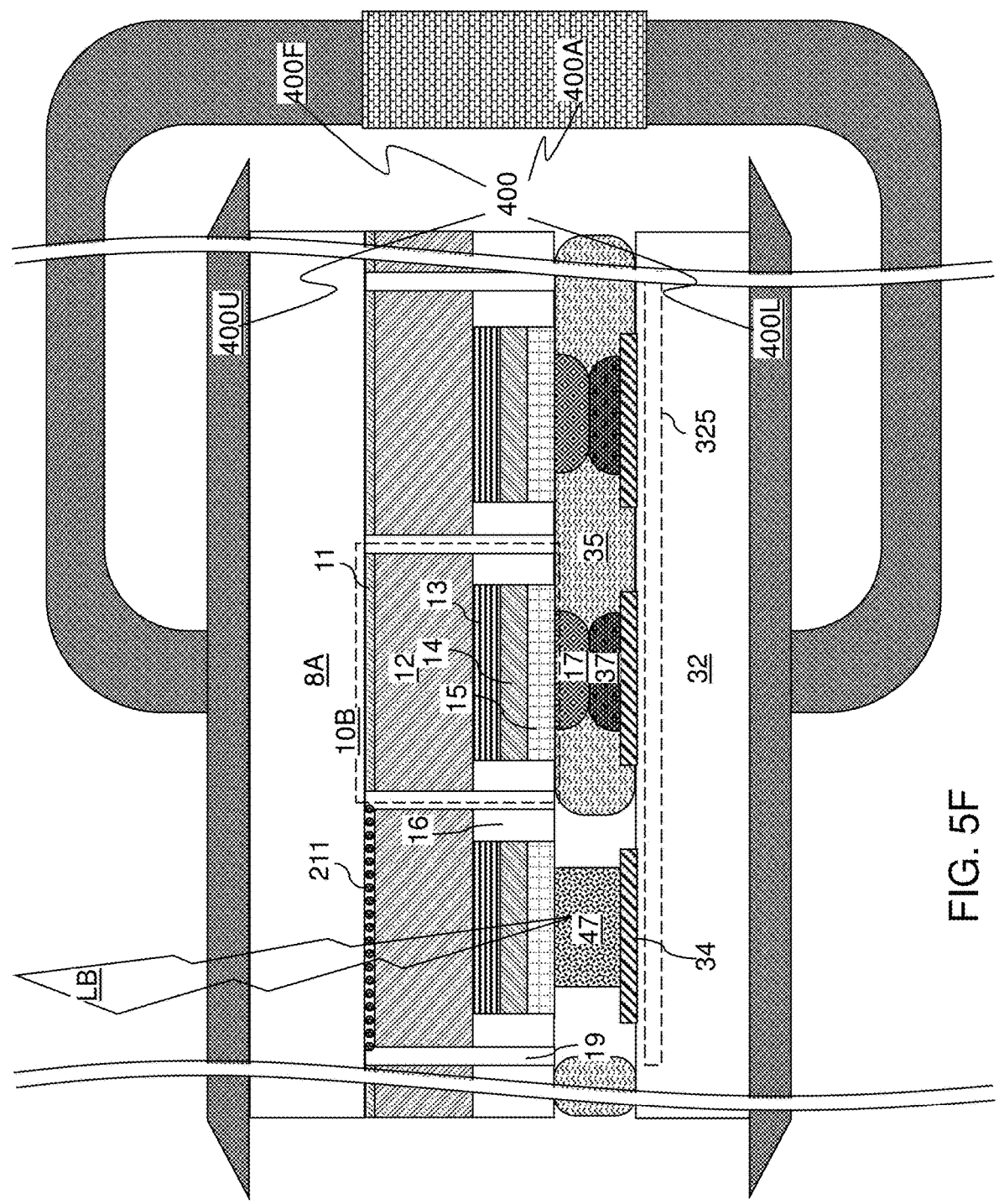
FIG. 5F is a vertical cross-sectional view of the first exemplary structure after a bonding laser irradiation according to the first embodiment of the present disclosure.

Referring to FIG. 5F, a sequential localized laser irradiation process can be performed to induce reflow and subsequent bonding of each mating pair of a diode-side bonding material portion 17 and a backplane-side bonding material portion 37 that underlies the first subset of the first light emitting diodes 10B to be transferred to the backplane 32. The laser irradiation induces bonding of the first subset of the first light emitting diodes 10B to the backplane 32, and is herein referred to as a bonding laser irradiation process. The laser beam LB employed during the bonding laser irradiation process has a photon energy that is less than the band gap of the III-V compound semiconductor materials (e.g., gallium and nitrogen containing materials) in the first light emitting diodes 10B, and thus passes through the first light emitting diodes 10B. For example, the laser beam LB employed during the bonding laser irradiation process may be an infrared laser beam such as a carbon dioxide laser beam having a wavelength of 9.4 microns or 10.6 microns.

The laser beam LB can sequentially irradiate each mating pair of a diode-side bonding material portion 17 and a backplane-side bonding material portion 37. Each irradiated pair of a diode-side bonding material portion 17 and a backplane-side bonding material portion 37 is heated to a reflow temperature at which the bonding materials (which may be solder materials) of the pair of the diode-side bonding material portion 17 and the backplane-side bonding material portion 37 reflow. Upon termination of the irradiation of the laser beam onto a mating pair of a diode-side bonding material portion 17 and a backplane-side bonding material portion 37, the reflowed material re-solidifies to provide a re-solidified bonding material portion 47. Each re-solidified bonding material portion 47 is bonded to a bonding pad 34 and contact-level material layers 15 of a first light emitting diode 10B.

Generally, the first subset of the first light emitting diodes 10B can be bonded to a respective underlying one of the bonding pads 34 by localized laser irradiation onto a respective underlying set of at least one bonding material portion (17, 37), which are reflowed and re-solidify to form a re-solidified bonding material portion 47. In one embodiment, each mating pair of the diode-side bonding material portions 17 and the backplane-side bonding material portions 37 can be pressed against each other at the second pressure during the localized laser irradiation. Each first light emitting diode 10B within the first subset of the first light emitting diodes 10B can be bonded to the backplane 32, and each first light emitting diode 10B within the second subset of the first light emitting diodes 10B can remain not bonded to the backplane 32. The gallium-rich material portions 211 provide weak adhesion force between the first substrate 8A and a first conductivity type semiconductor layer 12. Since the first light emitting diodes 10B are held in place by the gallium-rich material portions 211, a lower power laser beam LB may be used than in prior art bonding processes. This further reduces damage to the backplane 32. The solder flux 35 may be evaporated during irradiation with laser beam LB or may be poured out after this step.

Referring to FIG. 5G, the first source coupon 1 and the backplane 32 are removed from the clamp 400 and heated to a temperature above the melting temperature of the gallium-rich material portions 211 but below the melting temperature of the amorphous buffer layers 11 (e.g., below the melting temperature of gallium nitride). For example, if the gallium-rich material portions 211 comprise pure gallium, then the temperature is raised to at least 30 degrees Celsius, such as 35 to 50 degrees Celsius to melt to the gallium-rich material portions 211 into gallium-rich drops 111. This separates a first assembly of the backplane 32 and the first subset of the first light emitting diodes 10B from a second assembly of the first substrate 8A and the second subset of the first light emitting diodes 10B with or without applying a mechanical force. For example, the second assembly can be pulled apart from the first assembly with a force less than 100 N. Optionally, a gallium-rich material portion 311 (such as re-solidified gallium-rich drops 111 or remnants of portion 211) can be located on a surface of a first conductivity type semiconductor layer 12. The gallium-rich material portion 311 includes gallium at an atomic concentration greater than 55%, which may be greater than 95%. In one embodiment, the gallium-rich material portions 311 can consist essentially of gallium, and may have a thickness in a range from 5 nm to 100 nm, such as from 10 nm to 50 nm.

If a single color LED device is desired, then the fabrication process ends at the step shown in FIG. 5G. Alternatively, the steps shown in FIGS. 5A to 5G may be repeated to bond different color LEDs to the backplane 32 to form a multi-color display.

Figure 6A:
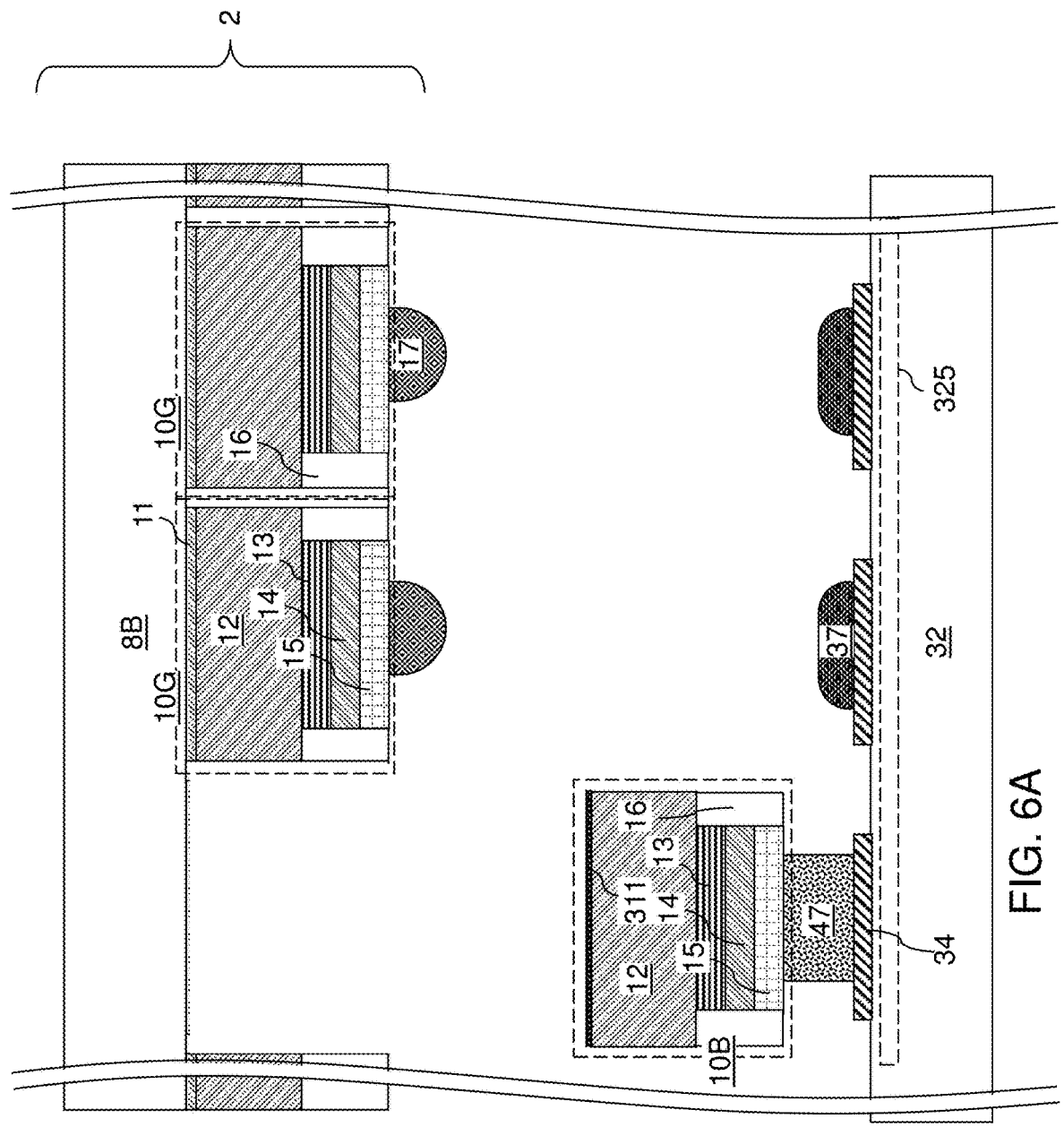
FIG. 6A is a vertical cross-sectional view of the first exemplary structure after aligning a second source coupon containing second light emitting diodes located on a second substrate to the first assembly according to the first embodiment of the present disclosure.

Referring to FIG. 6A, a second source coupon 2 can be provided, which includes second light emitting diodes 10G located on a second substrate 8B. Each of the second light emitting diodes 10G can comprise a respective additional buffer layer 11 at an interface with the second substrate 8B. The second light emitting diodes 10G can be arranged in a pattern including vacancies that include a mirror image pattern of the first subset of the first light emitting diodes 10B in the first assembly. In one embodiment, the second light emitting diodes 10G can emit light at a second peak wavelength that is different from the first peak wavelength. The second source coupon and the first assembly can be aligned to each other such that each first light emitting diode 10B on the backplane 32 underlies a respective one of the vacancies in the second source coupon.

Figure 6B:
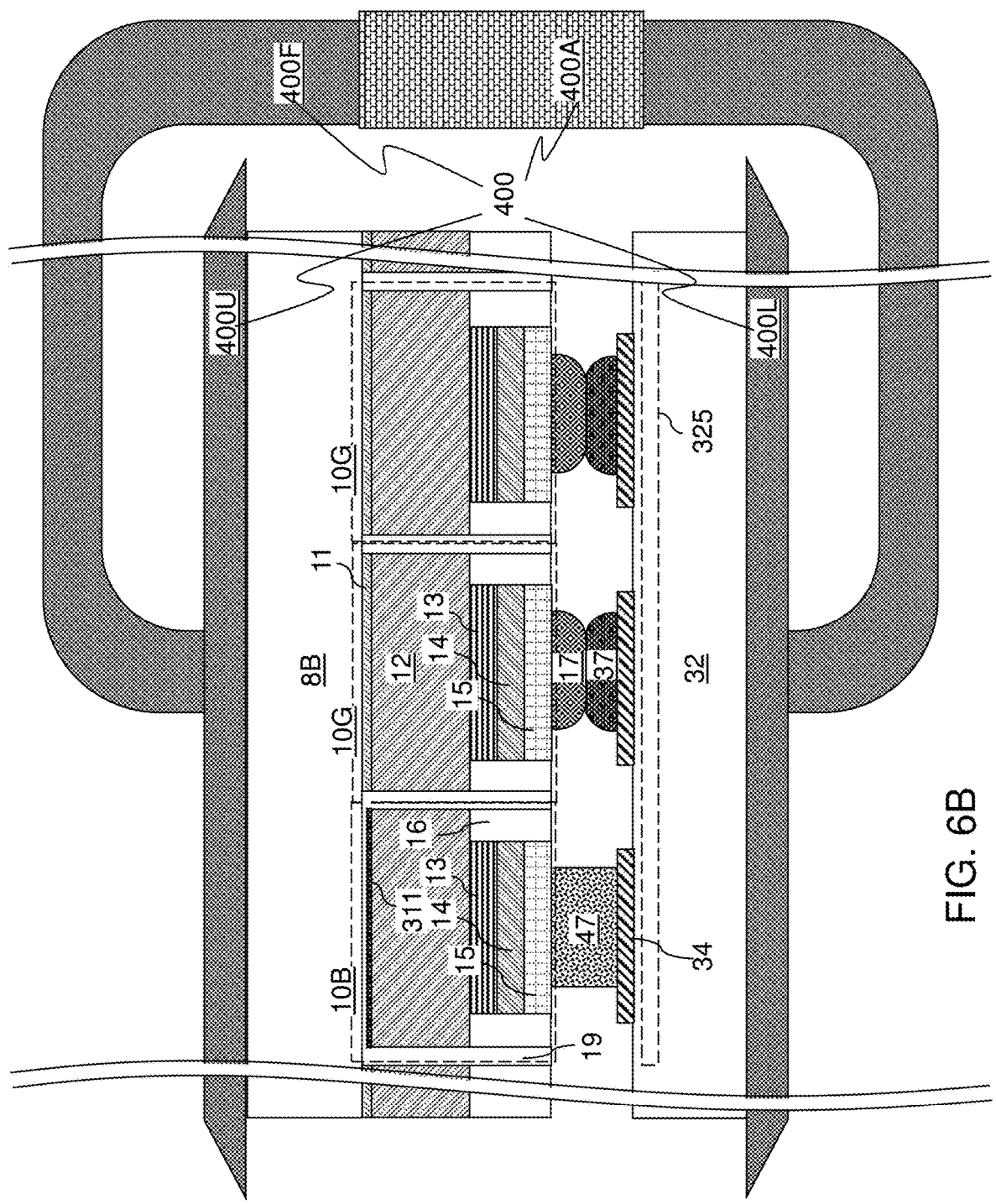
FIG. 6B is a vertical cross-sectional view of the first exemplary structure after aligning and clamping the second source coupon to the first assembly according to the first embodiment of the present disclosure.

Referring to FIG. 6B, the second light emitting diodes 10G can be disposed over the first assembly such that at least one additional bonding material portion (17, 37) is disposed between each vertically neighboring pair of a respective one of the bonding pads 34 and a respective one of the second light emitting diodes 10G. The second source coupon 2 can be aligned and clamped to the first assembly employing a clamp 400 using the processing step described above with respect to FIG. 5B. The solder flux 35 (not shown for clarity) may be used during these steps as well.

A subset of the additional buffer layers 11 can be converted into additional gallium-rich material portions 211 by performing the processing steps of FIG. 5C and FIG. 5D on each additional buffer layers 11 within a first subset of the second light emitting diodes 10G to be subsequently transferred to the backplane 32.

The processing steps of FIGS. 5E and 5F can be subsequently performed to bond the first subset of the second light emitting diodes 10G to a respective underlying one of the bonding pads 34 by localized laser irradiation onto a respective underlying set of at least one additional bonding material portions (17, 37). Each irradiated pair of a diode-side bonding material portion 17 and a backplane-side bonding material portion 37 is heated to a reflow temperature at which the bonding materials (which may be solder materials) of the pair of the diode-side bonding material portion 17 and the backplane-side bonding material portion 37 reflow. Upon termination of the irradiation of the laser beam onto a mating pair of a diode-side bonding material portion 17 and a backplane-side bonding material portion 37, the reflowed material re-solidifies to provide a re-solidified bonding material portion 47. Each re-solidified bonding material portion 47 is bonded to a bonding pad 34 and contact-level material layers 15 of a second light emitting diode 10G.

Figure 6C:
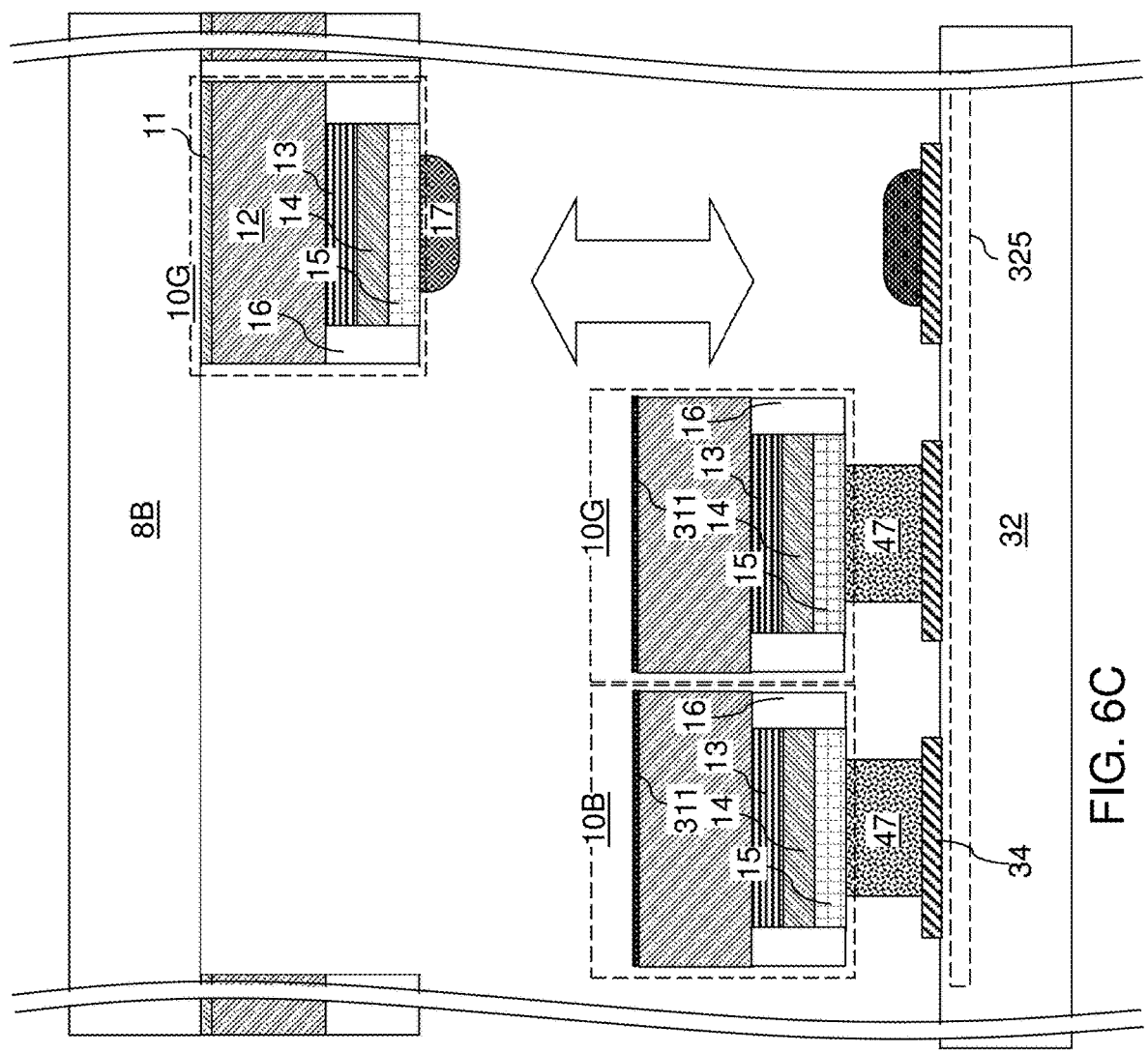
FIG. 6C is a vertical cross-sectional view of the first exemplary structure after detaching a third assembly of the backplane, a first subset of the first light emitting diodes, and a first subset of the second light emitting diodes from a fourth assembly of the second substrate and a second subset of the second light emitting diodes according to the first embodiment of the present disclosure.

Referring to FIG. 6C, a third assembly of the backplane 32, the first subset of the first light emitting diodes 10B, and the first subset of the second light emitting diodes 10G can be separated (i.e., detached) from a fourth assembly of the second substrate 8B and a second subset of the second light emitting diodes 10G that are not bonded to the backplane 32 by separating them at the additional gallium-rich material portions 211. A gallium-rich material portion 311 (such as a re-solidified gallium-rich layer) can be located on a surface of a first conductivity type semiconductor layer 12 of a second light emitting diode 10G.

Figure 7:
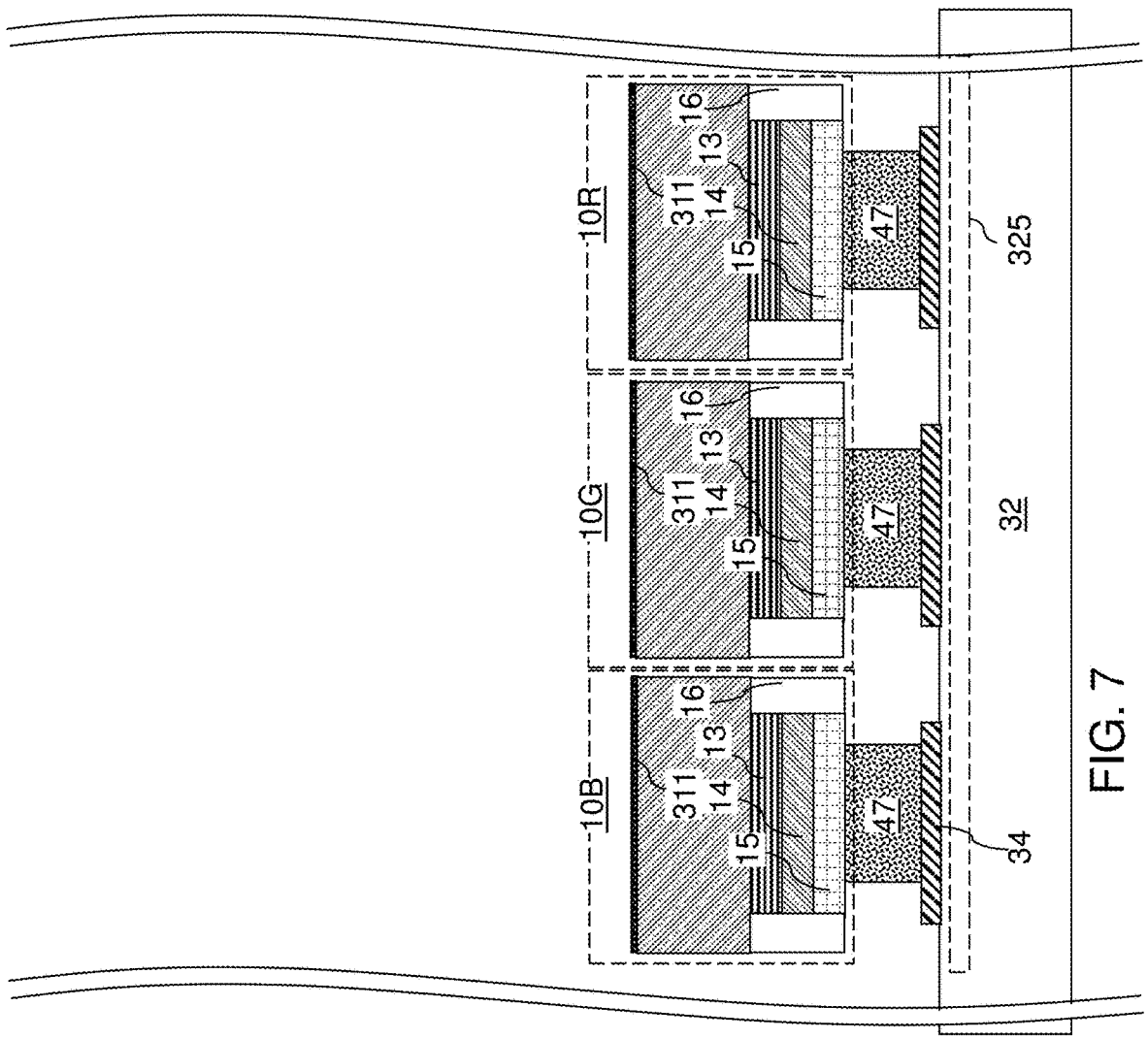
FIG. 7 is a vertical cross-sectional view of the first exemplary structure after transferring third light emitting diodes to the backplane according to the first embodiment of the present disclosure.

Referring to FIG. 7, a third source coupon can be provided, which includes third light emitting diodes 10R located on a third substrate. Each of the third light emitting diodes 10R can comprise a respective additional buffer layer at an interface with the third substrate. The third light emitting diodes 10R can be arranged in a pattern including vacancies that include a mirror image pattern of the first subset of the first light emitting diodes 10B and the first subset of the second light emitting diodes 10G in the third assembly. In one embodiment, the third light emitting diodes 10R can emit light at a third peak wavelength that is different from the first peak wavelength and from the second peak wavelength.

The processing steps of FIGS. 5B-5G can be performed to transfer a first subset of the third light emitting diodes 10R to the backplane 32. The backplane 32 can include an array of pixels to provide a direct view display device. Each pixel can include one or more of the LEDs (10B, 10G, 10R). In one embodiment, the backplane 32 can be a display frame for a direct view display device, and each pixel of the direct view display device may include at least one red-light emitting diode (such as a third light emitting diode 10R) configured to emit light at a peak wavelength in a range from 620 nm to 750 nm, at least one green-light emitting diode (such as a second light emitting diode 10G) configured to emit light at a peak wavelength in a range from 495 nm to 570 nm, and at least one blue-light emitting diode (such as a first light emitting diode 10B) configured to emit light at a peak wavelength in a range from 450 to 495 nm.

Figure 8A:
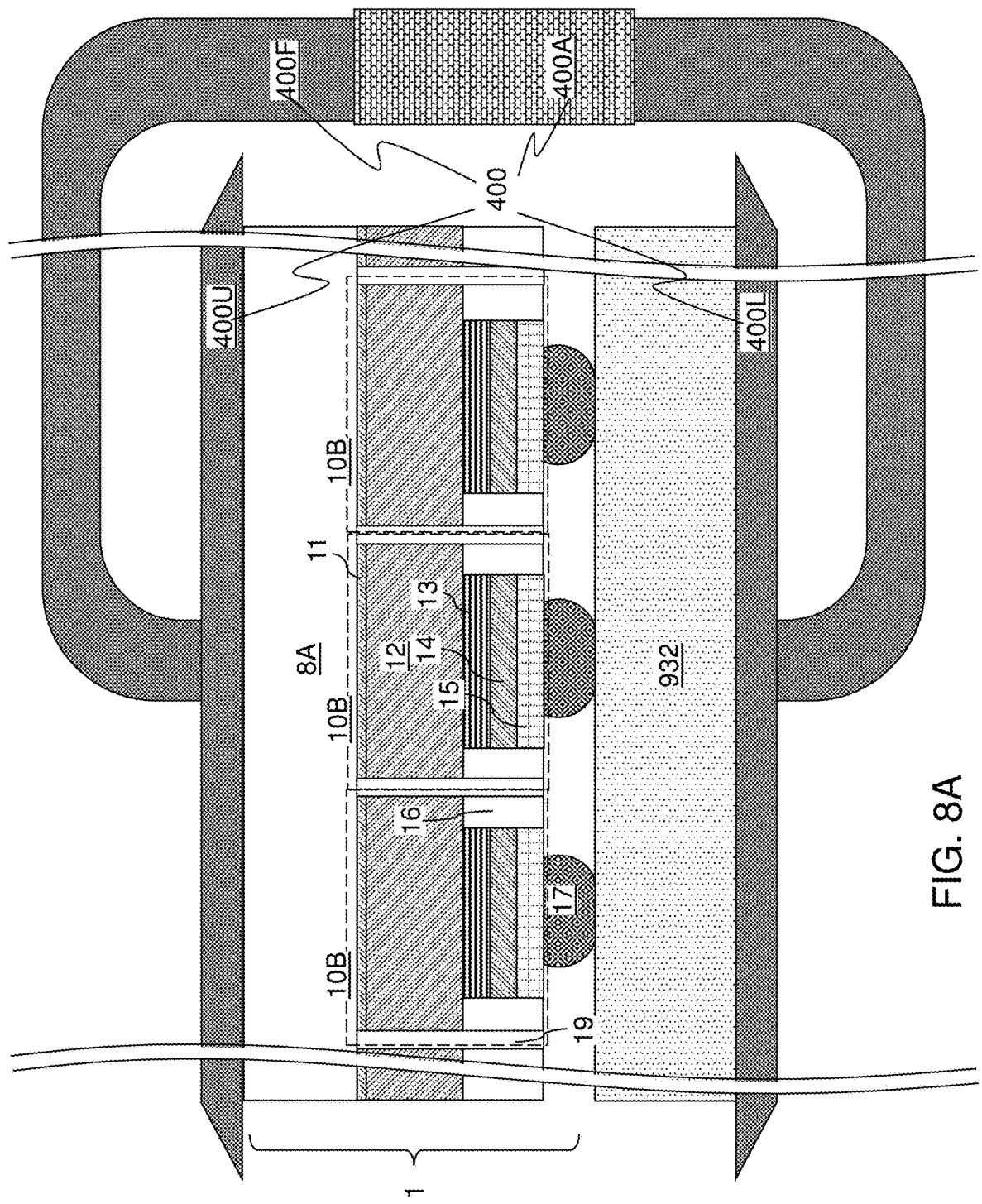
FIG. 8A is a vertical cross-sectional view of a second exemplary structure after stamping diode-side bonding material portions on first light emitting diodes against a dummy substrate according to a second embodiment of the present disclosure.

Referring to FIG. 8A, a second exemplary structure can be derived from the first exemplary structure of FIG. 5B by replacing the combination of the backplane 32, the bonding pads 34, and the backplane-side bonding material portions 37 with flat (i.e., planar) surface. The flat surface may comprise a flat surface of a dummy substrate 932 or a flat surface of a support, such as a stage, chuck or clamp. Thus, a diode-side bonding material portion 17 can be formed on each of the first light emitting diodes 10B prior to clamping the first supply coupon 1 with a clamp 400 to the flat surface, such as a planar surface of the dummy substrate.

In an illustrative example, the dummy substrate 932 and the first source coupon 1 can be lightly pressed against each other such that the diode-side bonding material portions 17 are not deformed. In an illustrative example, if 100,000 diode-side bonding material portions 17 are provided in the first source coupon 1, the magnitude of the compressive force applied by the clamp 400 may be in a range from 100 N to 200 N.

Figure 8B:
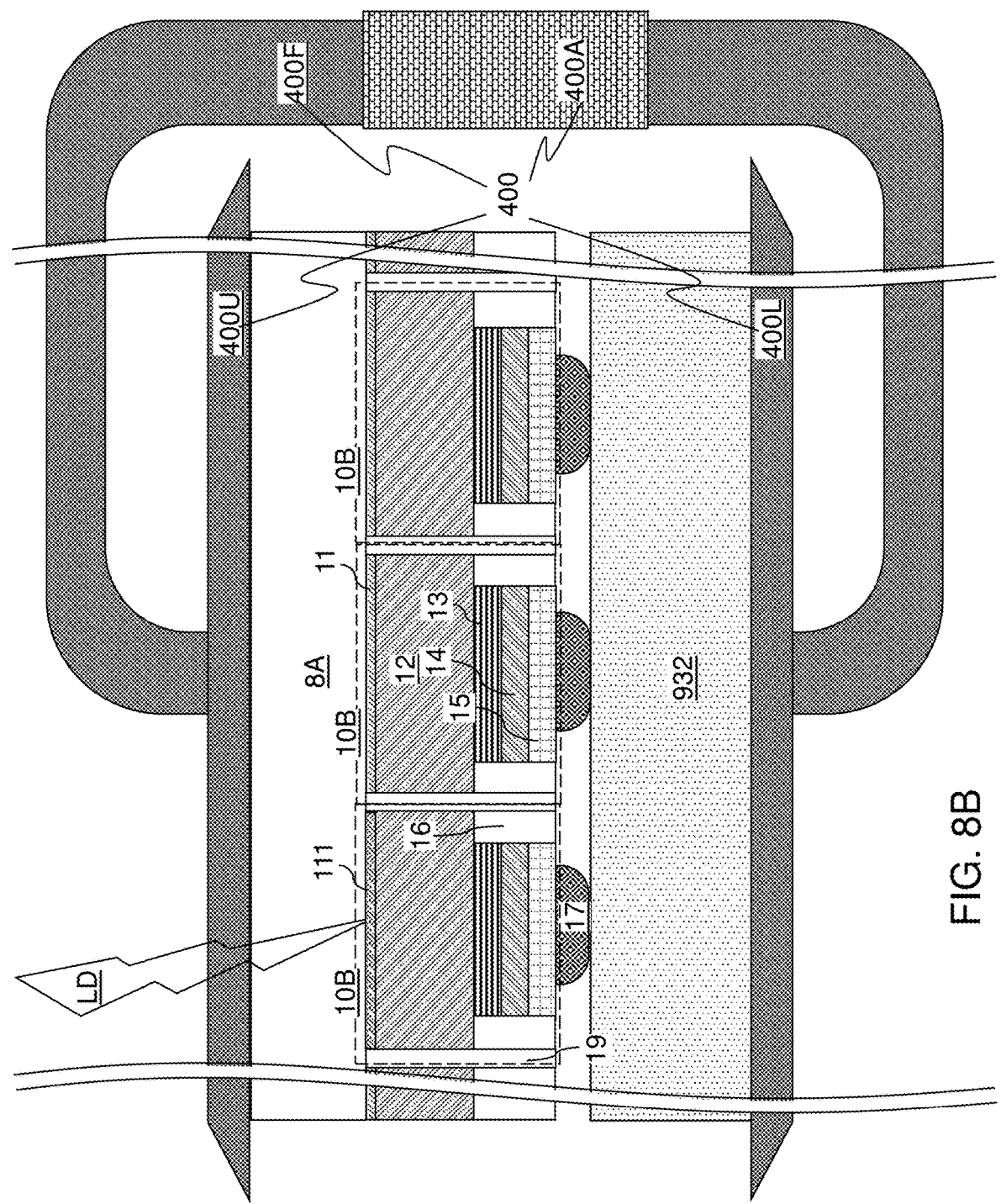
FIGS. 8B and 8C are vertical cross-sectional views of the second exemplary structure after sequential detachment and partial adhesion laser irradiation steps according to the second embodiment of the present disclosure.

Referring to FIG. 8B, a first laser irradiation process is performed while the diode-side bonding material portions 17 are disposed on the planar surface of the dummy substrate 932. Each buffer layer 11 of a first light emitting diode 10B to be detached is irradiated with a laser beam, which is herein referred to as a detachment laser beam LD. The set of all first light emitting diodes 10B that are subsequently detached is herein referred to as a first subset of the first light emitting diodes 10B. Each buffer layer 11 can be sequentially irradiated with the detachment laser beam LD one by one. The lateral dimension (such as a diameter) of the detachment laser beam LD can be about the same as the lateral dimension of a first light emitting diode 10B. Thus, each buffer layer 11 can be individually irradiated without causing significant compositional changes in neighboring buffer layers 11.

The detachment laser beam LD can have an ultraviolet wavelength or a wavelength in a visible light range, and may be absorbed by a III-V compound semiconductor material of the buffer layers 11. Irradiation of the detachment laser beam LD onto a buffer layer 11 is believed to evaporate nitrogen atoms without evaporating, or with minimal evaporation of, gallium atoms, and thus, reduces the atomic percentage of nitrogen in a remaining material. In one embodiment, the irradiated subset of the buffer layers within the first subset of the first light emitting diodes 10B may be converted into gallium-rich drops 111. The gallium-rich drops 111 may include gallium at an atomic concentration greater than 55%, as described above. Furthermore, the thermal shock of the laser irradiation is believed to coin (e.g., flatten) the diode-side bonding material portions 17 against the relatively harder, planar surface of the dummy substrate 932.

Figure 8C:
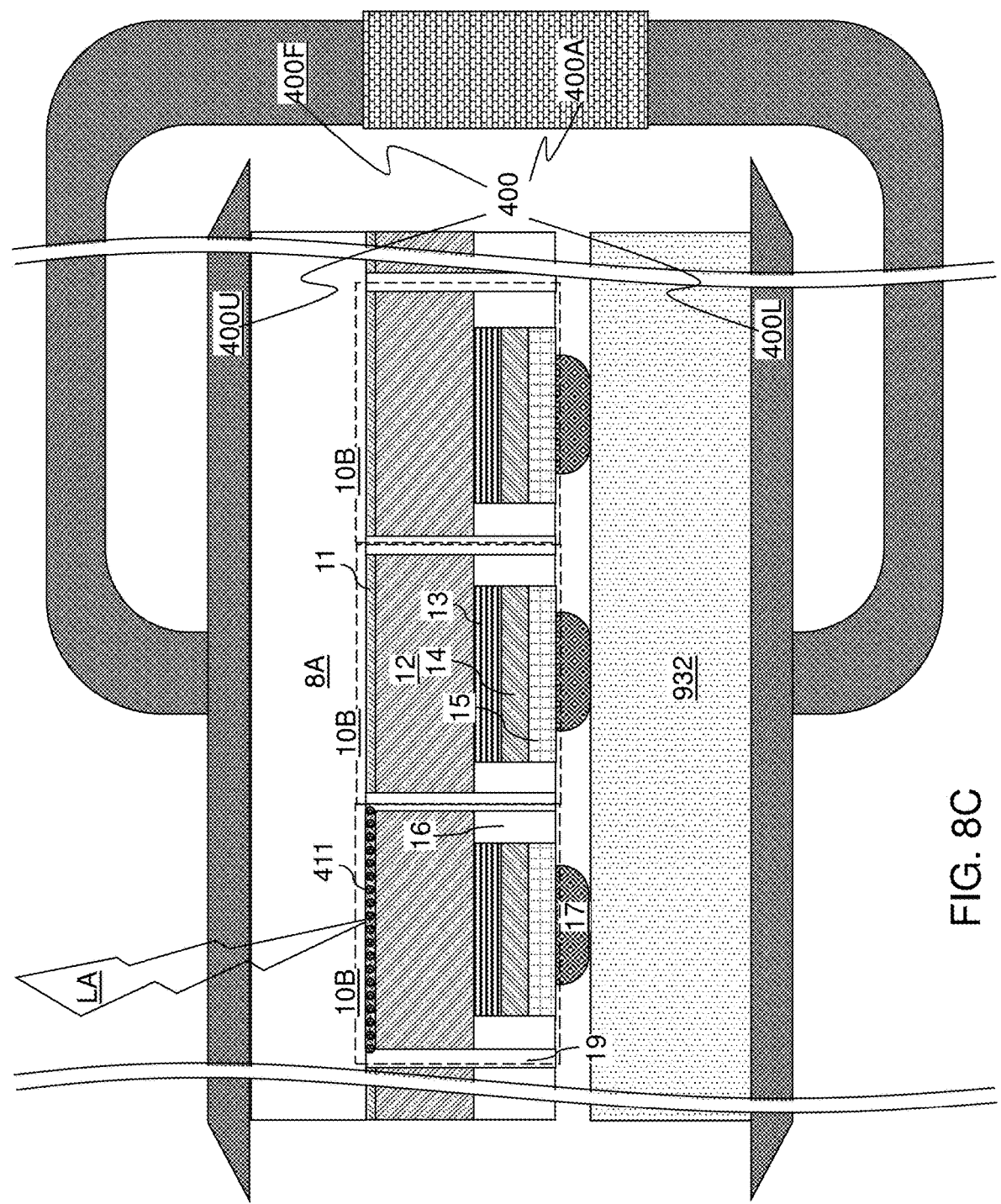

Referring to FIG. 8C a second laser irradiation process is performed on the first subset of the first light emitting diodes 10B while the diode-side bonding material portions 17 are disposed on the planar surface of the dummy substrate 932. The second laser beam is referred to herein as an attachment laser beam LA. Without wishing to be bound by a particular theory, it is believed that the attachment laser beam LA causes the gallium-rich drops 111 and/or the gallium-rich material portions 211 (if the gallium-rich drops 111 solidify after irradiation with the detachment laser beam LD) to reflow and become more sticky to form a gallium-rich adhesion portions 411 which weakly attach (i.e., partially connects) the irradiated first light emitting diode 10B to the first substrate 8A. The attachment laser beam LA may have the same parameters (i.e., wavelength and power) as the detachment laser beam LD. The gallium-rich adhesion portions 411 may have a larger adhesive strength than the gallium-rich material portions 211.

In one embodiment, the gallium-rich adhesion portions 411 can include gallium atoms at an atomic concentration greater than 55%, including greater than 90%, such as 60% to 100%. The gallium-rich adhesion portions 411 can have an average thickness in a range from 5 nm to 100 nm, such as from 10 nm to 50 nm, although lesser and greater thicknesses can also be employed. Each gallium-rich adhesion portion 411 may comprise a continuous material layer, or may comprise a cluster of ball-shaped material portions. The subset of the buffer layers 11 located within the second subset of the first light emitting diodes 10B that are not irradiated with the laser beams LD and LA remain as buffer layers 11.

Figure 8D:
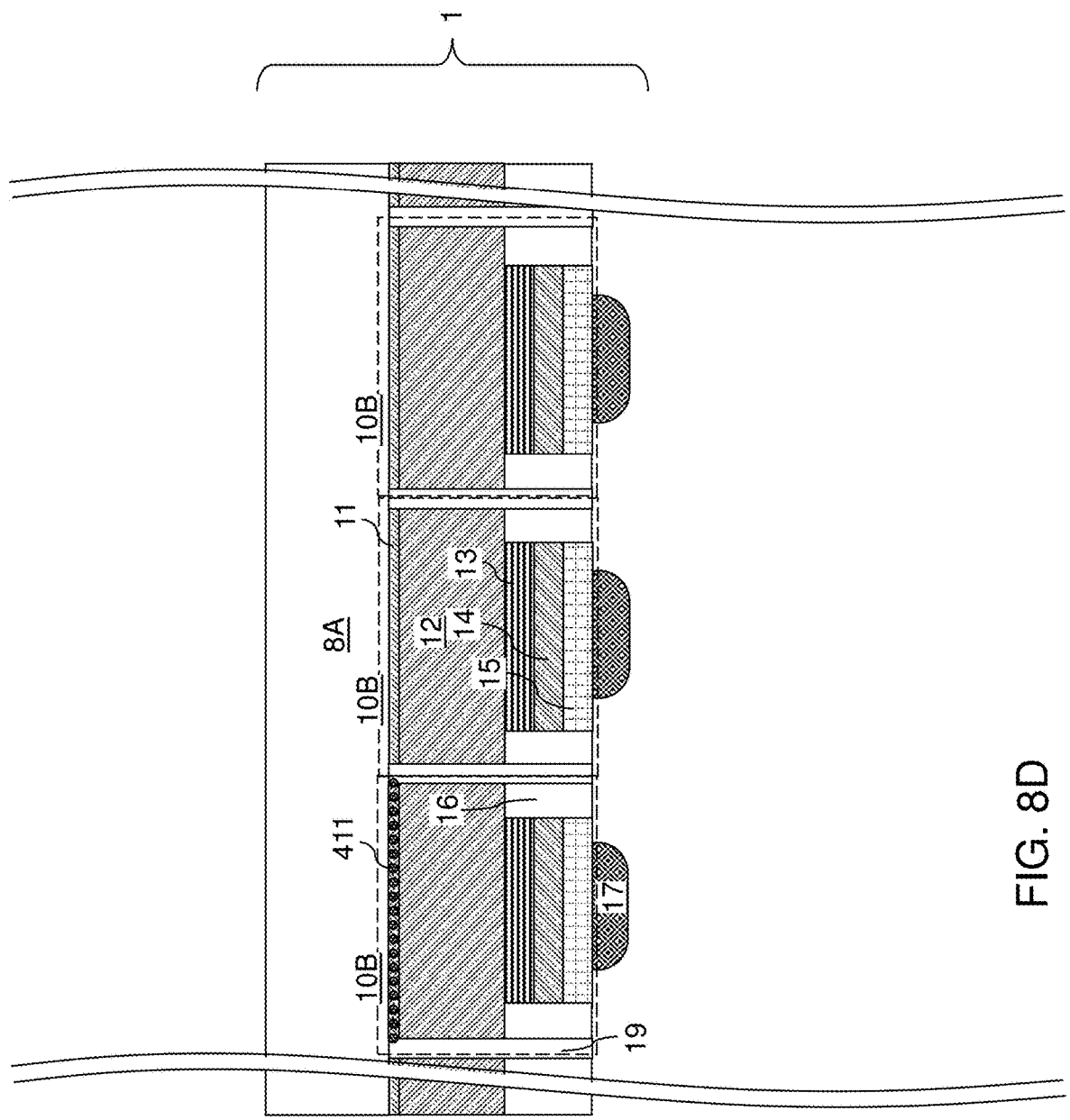
FIG. 8D is a vertical cross-sectional view of the second exemplary structure after detaching the first source coupon from the dummy substrate according to the second embodiment of the present disclosure.

Referring to FIG. 8D, the first source coupon 1 is detached from the dummy substrate 932 by unclamping the clamp 400 and removing the assembly of the first substrate 8A and all first light emitting diodes 10B from the clamp 400. The gallium-rich adhesion portions 411 provide less adhesion (i.e., lower adhesion magnitude) between the first substrate 8A and a respective underlying first light emitting diode 10B of the first subset than the adhesion provided by the buffer layers 11 between the first substrate 8A and a respective underlying first light emitting diode 10B of the second subset. However, the strength of adhesion provided by the gallium-rich adhesion portions 411 is sufficient to adhere the underlying first light emitting diodes 10B of the first subset to the first substrate 8A during transfer of the first source coupon 1. The first source coupon 1 may be stored for future use (e.g., for future attaching the first light emitting diodes 10B of the first subset to a backplane). In an alternative embodiment, all first light emitting diodes 10B on the first substrate 8A are irradiated with the laser beams LD and LA, and all buffer layers 11 are converted to the gallium-rich adhesion portions 411. In this alternative embodiment, there is no second set of first light emitting diodes 10B, and all first light emitting diodes 10B of the first source coupon 1 may be transferred to the same backplane 32.

Figure 8E:
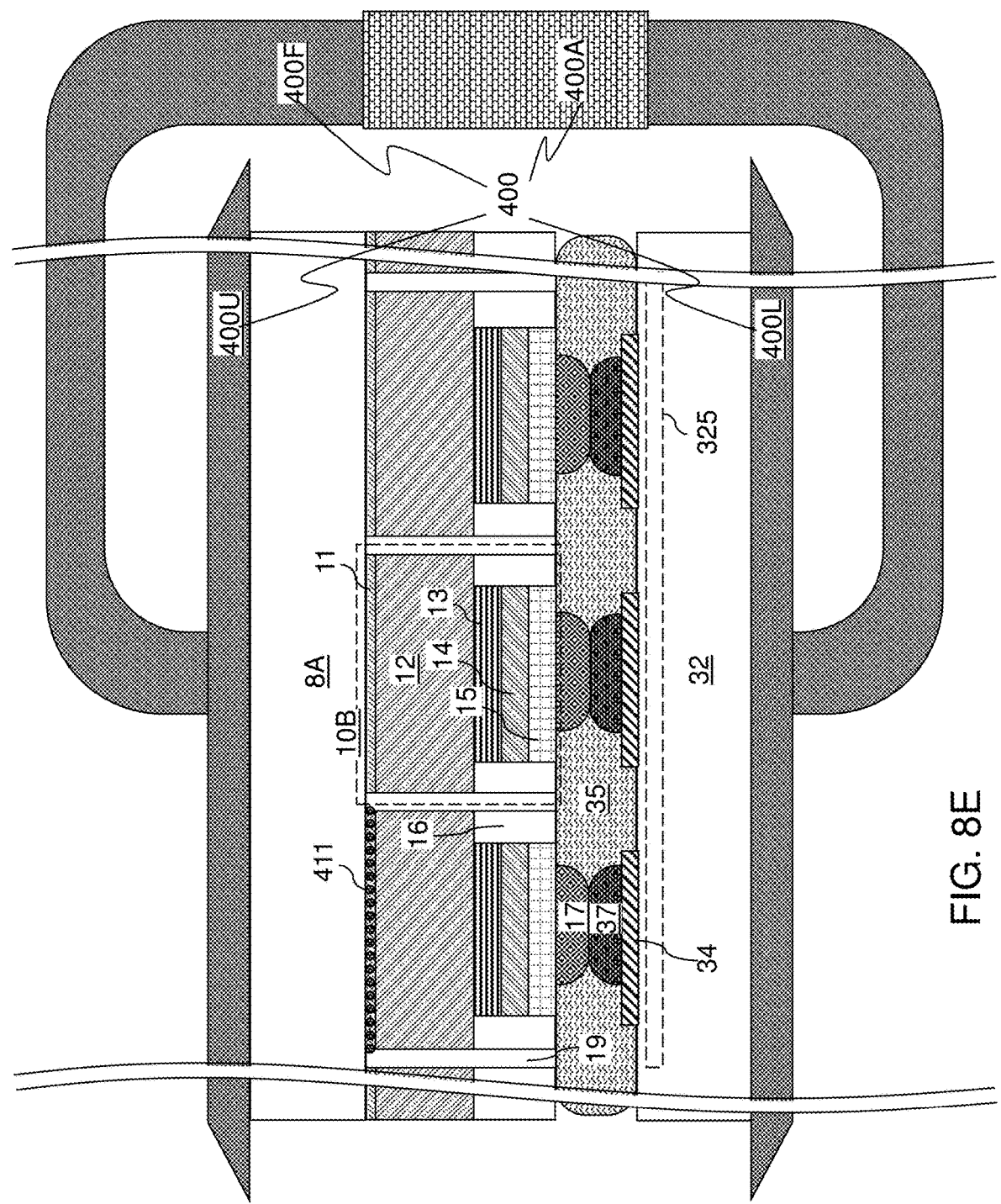
FIG. 8E is a vertical cross-sectional view of the second exemplary structure after aligning and clamping the backplane and the first source coupon according to the second embodiment of the present disclosure.

Referring to FIG. 8E, the first source coupon 1 is disposed onto a backplane 32 with bonding pads 34 and backplane-side bonding material portions 37 thereupon. Optional solder flux 35 may be applied around the bonding material portions (17, 37). The first source coupon 1 and the backplane 32 can be aligned such that a mating pair of a diode-side bonding material portion 17 and a backplane-side bonding material portion 37 is located between each facing pair of a first light emitting diode 10B and a bonding pad 34.

A clamp 400 can be employed to hold the assembly of the first source coupon 1 and the backplane 32 in place.

Generally, the first light emitting diodes 10B can be disposed over the array of bonding pads 34 on the backplane 32 such that at least one bonding material portion (17, 37) is disposed between each vertically neighboring pair of a respective one of the bonding pads 34 and a respective one of the first light emitting diodes 10B. The backplane-side bonding material portions 37 can be stamped (e.g., coined) by pressing the diode-side bonding material portions 17 against a respective one of the backplane-side bonding material portions 37 after disposing the first light emitting diodes 10B over the array of bonding pads 34, as in the first embodiment. In an illustrative example, if 100,000 pairs of a diode-side bonding material portion 17 and a backplane-side bonding material portion 37 are present between the backplane 32 and the first source coupon 1, then magnitude of the compressive force applied by the clamp 400 may be in a range from 500 N to 1,000 N. In one embodiment, each of the at least one bonding material portion (17, 37) can comprise a stack of a respective one of the diode-side bonding material portions 17 and a respective one of the backplane-side bonding material portions 37.

Figure 8F:
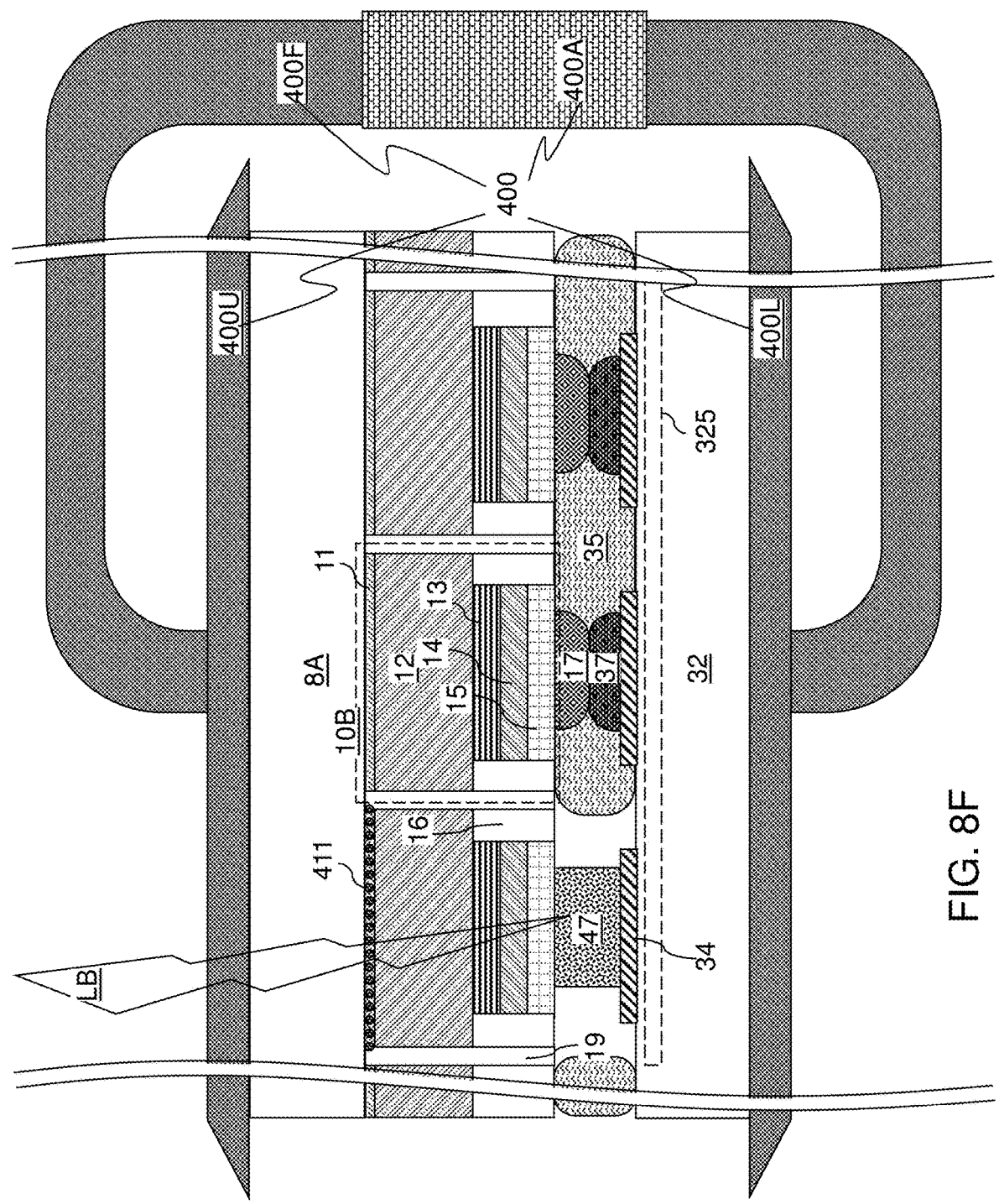
FIG. 8F is a vertical cross-sectional view of the second exemplary structure after a bonding laser irradiation according to the second embodiment of the present disclosure.

Referring to FIG. 8F, a third laser irradiation process can be performed, which is a local laser irradiation process that induces reflow of each mating pair of a diode-side bonding material portion 17 and a backplane-side bonding material portion 37 that underlies the first subset of the first light emitting diodes 10B to be transferred to the backplane 32. The local laser irradiation process induces bonding of the first subset of the first light emitting diodes 10B to the backplane 32, and is herein referred to as a bonding laser irradiation process. The laser beam LB employed during the bonding laser irradiation process has a photon energy that is less than the band gap of the III-V compound semiconductor materials in the first light emitting diodes 10B, and thus passes through the first light emitting diodes 10B. For example, the laser beam LB employed during the bonding laser irradiation process may be an infrared laser beam such as a carbon dioxide laser beam having a wavelength of 9.4 microns or 10.6 microns.

The laser beam LB can sequentially irradiate each mating pair of a diode-side bonding material portion 17 and a backplane-side bonding material portion 37 underlying the first light emitting diodes 10B of the first subset. Each irradiated pair of a diode-side bonding material portion 17 and a backplane-side bonding material portion 37 is heated to a reflow temperature at which the bonding materials (which may be solder materials) of the pair of the diode-side bonding material portion 17 and the backplane-side bonding material portion 37 reflow. Upon termination of the irradiation of the laser beam onto a mating pair of a diode-side bonding material portion 17 and a backplane-side bonding material portion 37, the reflowed material re-solidifies to provide a re-solidified bonding material portion 47. Each re-solidified bonding material portion 47 is bonded to a bonding pad 34 and contact-level material layers 15 of a first light emitting diode 10B of the first subset.

Generally, the first subset of the first light emitting diodes 10B can be bonded to a respective underlying one of the bonding pads 34 by localized laser irradiation onto a respective underlying set of at least one bonding material portion (17, 37), which is reflowed and re-solidifies to form a re-solidified bonding material portion 47. In one embodiment, each mating pair of the diode-side bonding material portions 17 and the backplane-side bonding material portions 37 can be pressed against each other at the second pressure during the localized laser irradiation. Each first light emitting diode 10B within the first subset of the first light emitting diodes 10B can be bonded to the backplane 32, and each first light emitting diode 10B within the second subset of the first light emitting diodes 10B can remain not bonded from the backplane 32. The first source coupon 1 and the backplane 32 can be held in place by pressing against each other through the array of first light emitting diodes 10B and through the bonding material portions (17, 37, 47) during the localized laser irradiation.

Figure 8G:
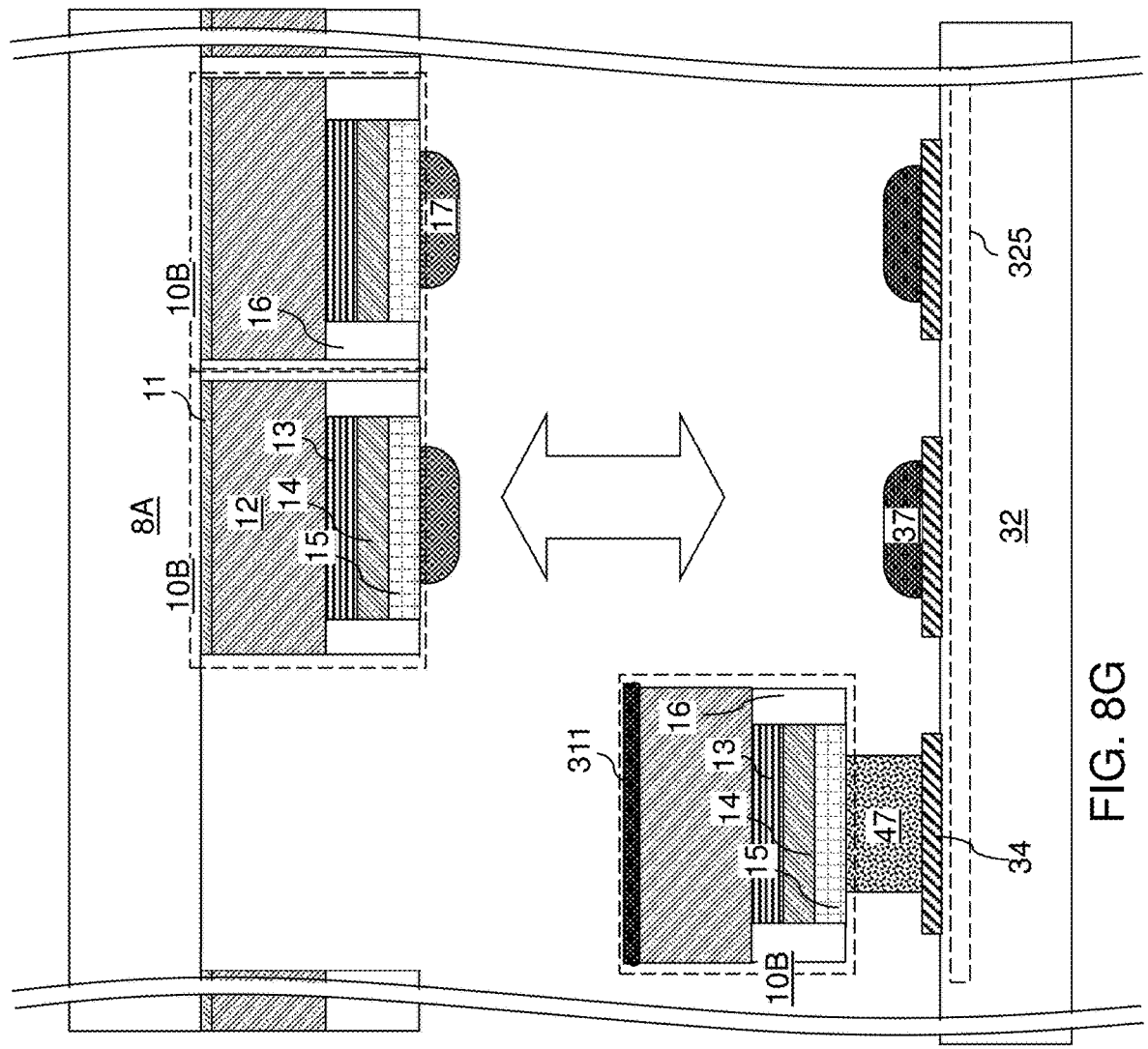
FIG. 8G is a vertical cross-sectional view of the second exemplary structure after detaching a first assembly of the backplane and a first subset of the first light emitting diodes from a second assembly of the first substrate and a second subset of the first light emitting diodes according to the second embodiment of the present disclosure.

Referring to FIG. 8G, a first assembly of the backplane 32 and the first subset of the first light emitting diodes 10B can be detached from a second assembly of the first substrate 8A and the second subset of the first light emitting diodes 10B by annealing the first assembly above the melting temperature of the gallium-rich bonding portions 411. For example, if the gallium-rich bonding portions 411 comprise pure gallium, then the temperature is raised to at least 30 degrees Celsius, such as 35 to 50 degrees Celsius to melt to the gallium-rich bonding portions 411 into gallium-rich drops. This separates a first assembly of the backplane 32 and the first subset of the first light emitting diodes 10B from a second assembly of the first substrate 8A and the second subset of the first light emitting diodes 10B with or without applying a mechanical force. For example, the second assembly can be pulled apart from the first assembly. The adhesion provided by the gallium-rich drops is weak, separation may be induced by a force less than 100 N.

Optionally, a gallium-rich material portion 311 (which may comprise a remnant of the gallium-rich adhesion portion 411) can be located on a surface of a first conductivity type semiconductor layer 12. The gallium-rich material portion 311 includes gallium at an atomic concentration greater than 55%, which may be greater than 95%, such as 96% to 100%. In one embodiment, the gallium-rich material portions 311 can consist essentially of gallium, and may have a thickness in a range from 5 nm to 100 nm, such as from 10 nm to 50 nm.

If a single color LED device is desired, then the fabrication process ends at the step shown in FIG. 8G. Alternatively, the steps shown in FIGS. 8A to 8G may be repeated to bond different color LEDs to the backplane 32 to form a multi-color display.

Referring to FIG. 9A, a second source coupon 2 can be provided, which includes second light emitting diodes 10G located on a second substrate 8B. Each of the second light emitting diodes 10G can comprise a respective additional buffer layer 11 at an interface with the second substrate 8B. The second light emitting diodes 10G can be arranged in a pattern including vacancies that include a mirror image pattern of the first subset of the first light emitting diodes 10B in the first assembly. In one embodiment, the second light emitting diodes 10G can emit light at a second peak wavelength that is different from the first peak wavelength.

The processing steps of FIGS. 8A-8D can be performed employing the second source coupon 2 instead of the first source coupon 1 to perform partial laser liftoff and coin the diode-side bonding material portions 17 on the second light emitting diodes 10G in the second source coupon 2.

Figure 9B:
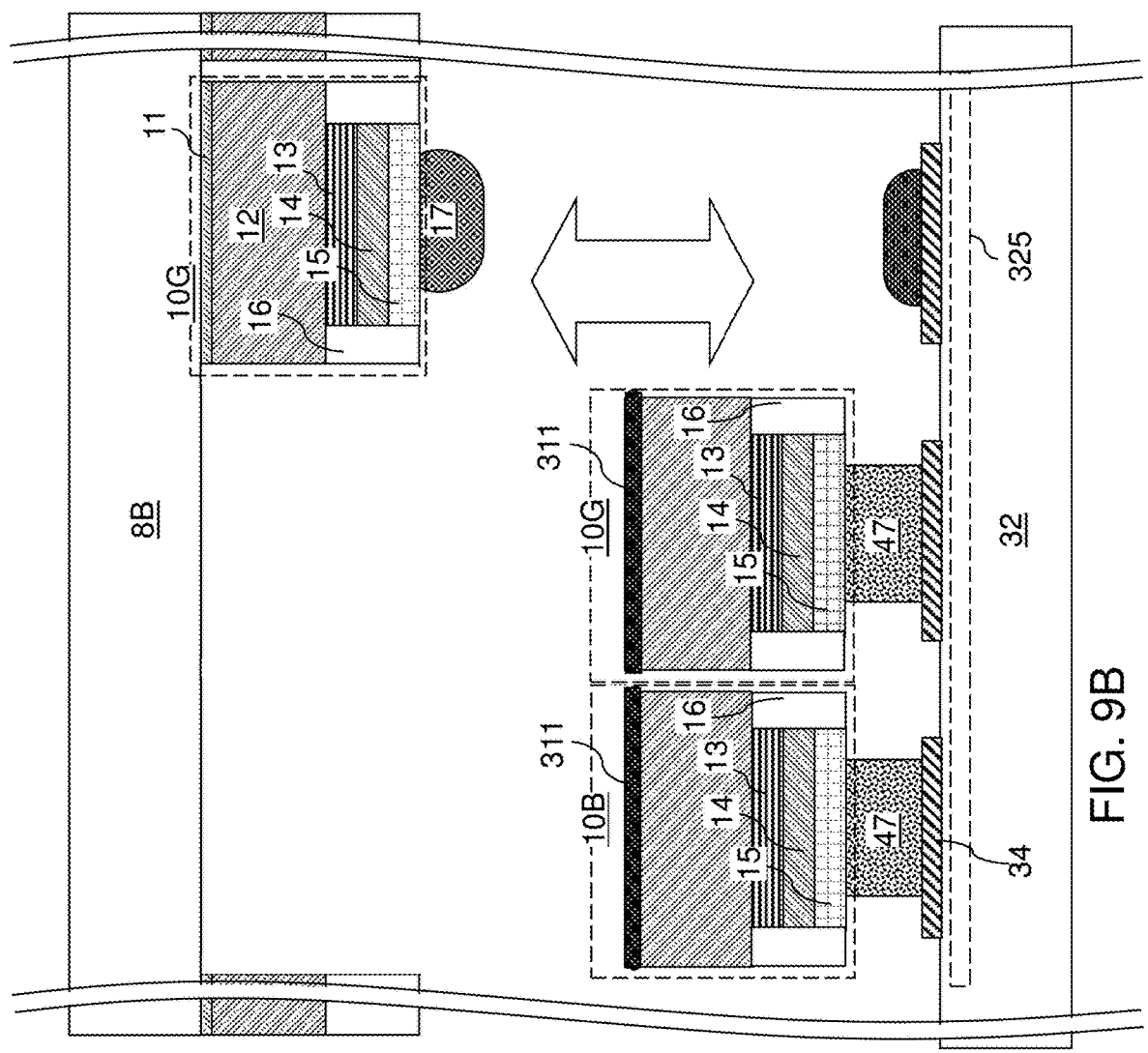
FIG. 9B is a vertical cross-sectional view of the second exemplary structure after detaching a third assembly of the backplane, a first subset of the first light emitting diodes, and a first subset of the second light emitting diodes from a fourth assembly of the second substrate and a second subset of the second light emitting diodes according to the second embodiment of the present disclosure.

Referring to FIG. 9B, the second source coupon 2 and the first assembly can be aligned to each other such that each first light emitting diode 10B on the backplane 32 underlies a respective one of the vacancies in the second source coupon. Then, the processing steps of FIGS. 8E-8G can be performed to convert a subset of the additional buffer layers 11 into additional gallium-rich adhesion portions 411, to bond a first subset of the second light emitting diodes 10G to a respective underlying one of the bonding pads 34 by localized laser irradiation onto a respective underlying set of at least one additional bonding material portion (17, 37), and to detach a third assembly of the backplane 32, the first subset of the first light emitting diodes 10B, and the first subset of the second light emitting diodes 10G from a fourth assembly of the second substrate 8B and a second subset of the second light emitting diodes 10G that is not transferred to the backplane 32.

Referring to FIG. 10, a third source coupon can be provided, which includes third light emitting diodes 10R located on a third substrate. Each of the third light emitting diodes 10R can comprise a respective additional buffer layer at an interface with the third substrate. In one embodiment, the third light emitting diodes 10R can emit light at a third peak wavelength that is different from the first peak wavelength and from the second peak wavelength.

The processing steps of FIGS. 8A-8G can be performed to transfer a first subset of the third light emitting diodes 10R to the backplane 32. The third light emitting diodes 10R can be arranged in a pattern including vacancies that include a mirror image pattern of the first subset of the first light emitting diodes 10B and the first subset of the second light emitting diodes 10G in the third assembly. The backplane 32 can include an array of pixels to provide a direct view display device as described above with respect to the first embodiment.

Referring to all drawings and according to various embodiments of the present disclosure, a light emitting diode assembly is provided, which comprises a backplane 32 containing bonding pads 34, and first light emitting diodes 10B attached to a first subset of the bonding pads 34 through a respective bonding material portion 47. Each of the first light emitting diodes 10B comprises a first conductivity type semiconductor layer 12, and a gallium-rich material portion 311 located on a surface of the first conductivity type semiconductor layer 12 and including gallium at an atomic concentration greater than 55%.

In one embodiment, each of the gallium-rich material portions 311 includes gallium atoms at an atomic concentration greater than 55%, such as greater than 90%. In one embodiment, the gallium-rich material portions 311 are free of nitrogen or include nitrogen atoms at an atomic concentration less than 5%. In one embodiment, the first conductivity type semiconductor layer 12 comprises a crystalline gallium nitride layer.

In one embodiment, the assembly may also include second light emitting diodes 10G attached to a second subset of the bonding pads 34 on the backplane 32 through a respective bonding material portion 47. Each of the second light emitting diodes 10G is configured to emit light of a different peak wavelength than each of the first light emitting diodes 10B. Each of the second light emitting diodes 10G comprises another first conductivity type semiconductor layer 12 and another gallium-rich material portion located 311 on a surface of the first conductivity type semiconductor layer and including gallium at an atomic concentration greater than 55%.

The various embodiments of the present disclosure provide a partial laser liftoff process including a partial die detachment method in which gallium and nitrogen containing buffer layers 11 are converted into gallium-rich material portions 311 having a low melting point. Localized laser irradiation is employed prior to bonding each mating pair of a bonding pad 34 and contact-level material layers within a subset of light emitting diodes (10B, 10G, 10R) to be transferred from a source coupon to the backplane 32. Thus, mechanical shock from detachment laser irradiation to the backplane 32 may be reduced or avoided. Detachment of remaining portions of a source coupon from a bonded assembly of the backplane 32 and an attached subset of the light emitting diodes may be performed by heating the bonded assembly to a relatively low temperature above the melting temperature of the a gallium-rich material portion 211 of the first embodiment or the gallium-rich material adhesion portions 411 of the second embodiment without the application of mechanical force or with the application of a low magnitude mechanical force, which does not damage the backplane 32.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A transfer method, comprising:
providing a first light emitting diode comprising a semiconductor material including gallium and nitrogen on a first substrate;
performing a partial laser liftoff of the first light emitting diode from the first substrate, wherein performing the partial liftoff of the first light emitting diode from the first substrate comprises irradiating the semiconductor material including gallium and nitrogen of the first light emitting diode with a detachment laser beam through the first substrate;
laser bonding the first light emitting diode to a backplane after performing the partial laser liftoff; and
separating the first substrate from the first light emitting diode after the laser bonding.

2. The method of claim 1, wherein:
the first light emitting diode contains an amorphous buffer layer comprising gallium and nitrogen between the first substrate and a crystalline semiconductor layer of a first conductivity type; and
irradiating the first light emitting diode with the detachment laser beam converts the amorphous buffer layer into liquid gallium-rich drops.

3. The method of claim 2, wherein:
the liquid gallium-rich drops solidify into gallium-rich material portions comprising at least 55 atomic percent gallium which connect the first light emitting diode to the first substrate; and
separating the first substrate from the first light emitting diode comprises heating the light emitting diode above a melting temperature of the gallium-rich material portions.

4. The method of claim 1, further comprising:
providing a first source coupon including the first light emitting diode and additional first light emitting diodes located over the first substrate, wherein each of the first light emitting diodes comprises a respective buffer layer comprising gallium and nitrogen at an interface with the first substrate;
providing the backplane including an array of bonding pads;

disposing the first light emitting diodes over the array of bonding pads such that at least one bonding material portion is disposed between each vertically neighboring pair of a respective one of the bonding pads and a respective one of the first light emitting diodes;

converting a subset of the buffer layers of a first subset of the first light emitting diodes into gallium-rich material portions including gallium atoms at an atomic concentration greater than 55% by the partial laser liftoff;

laser bonding the first subset of the first light emitting diodes to a respective underlying one of the bonding pads by localized laser irradiation onto a respective underlying set of at least one bonding material portion; and separating a first assembly of the backplane and the first subset of the first light emitting diodes from a second assembly of the first substrate and a second subset of the first light emitting diodes by melting the gallium-rich material portions.

5. The method of claim 4, wherein each of the gallium-rich material portions includes gallium atoms at an atomic concentration of greater than 90%.

6. The method of claim 5, wherein:
each of the first light emitting diodes comprises a first conductivity type semiconductor layer comprising gallium and nitrogen that is spaced from the first substrate by the respective buffer layer; and
each of the buffer layers consists essentially of gallium nitride.

7. The method of claim 4, further comprising pressing the first source coupon to the backplane during the partial laser liftoff.

8. The method of claim 7, further comprising:
forming a diode-side bonding material portion on each of the first light emitting diodes; and
forming a backplane-side bonding material portion on each of the bonding pads; and
pressing each mating pair of a respective diode-side bonding material portion and a respective backplane-side bonding material portion against each other with a first force prior to the partial laser liftoff.

9. The method of claim 8, further comprising coining the diode-side bonding material portions and the backplane-side bonding material portions by pressing each mating pair of a respective diode-side bonding material portion and a respective backplane-side bonding material portion against each other with a second force that is greater than the first force prior to the laser bonding.

10. The method of claim 4, further comprising:
providing a second source coupon including second light emitting diodes located over a second substrate, wherein each of the second light emitting diodes comprises a respective additional buffer layer at an interface with the second substrate, and the second light emitting diodes are arranged in a pattern including vacancies that include a mirror image pattern of the first subset of the first light emitting diodes in the first assembly;
disposing the second light emitting diodes over the first assembly such that at least one additional bonding material portion is disposed between each vertically neighboring pair of a respective one of the bonding pads and a respective one of the second light emitting diodes; converting a subset of the additional buffer layers into additional gallium-rich material portions including gallium atoms at an atomic concentration greater than 55% by another partial laser liftoff; laser bonding a first subset of the second light emitting diodes to a respective underlying one of the bonding pads by localized laser irradiation onto a respective underlying set of at least one additional bonding material portion; and separating a third assembly of the backplane, the first subset of the first light emitting diodes and the first subset of the second light emitting diodes from a fourth assembly of the second substrate and a second subset of the first light emitting diodes by melting the additional gallium-rich material portions.

11. The method of claim 1, further comprising:
providing a first source coupon including the first light emitting diode and additional first light emitting diodes located over the first substrate, wherein each of the first light emitting diodes comprises a respective buffer layer comprising gallium and nitrogen at an interface with the first substrate;
pressing the first light emitting diodes against a flat surface;
converting a first subset of the buffer layers within a first subset of the first light emitting diodes into gallium-rich drops by a first laser irradiation;
solidifying the gallium-rich drops into gallium-rich material portions including gallium atoms at an atomic concentration greater than 55%;
converting the gallium-rich material portions into gallium-rich adhesion portions having a higher adhesion strength than the gallium-rich material portions by a second laser irradiation;
removing the first light emitting diodes from the flat surface;
providing a backplane including an array of bonding pads;
disposing the first light emitting diodes over the array of bonding pads such that at least one bonding material portion is disposed between each vertically neighboring pair of a respective one of the bonding pads and a respective one of the first light emitting diodes;
laser bonding the first subset of the first light emitting diodes to a respective underlying one of the bonding pads by localized laser irradiation onto a respective underlying set of at least one bonding material portion; and
separating a first assembly of the backplane and the first subset of the first light emitting diodes from a second assembly of the first substrate and a second subset of the first light emitting diodes by melting the gallium-rich adhesion portions.

12. The method of claim 11, wherein the second subset of the first light emitting diodes is attached to the first substrate in the second assembly by a second subset of the buffer layers after being detached from the first assembly.

13. The method of claim 11, further comprising forming a diode-side bonding material portion on each of the first light emitting diodes.

14. The method of claim 13, wherein the diode-side bonding material portions are pressed against the flat surface during the step of first laser irradiation, and the first laser irradiation coins the diode-side bonding material portions.

15. The method of claim 11, wherein:
each of the first light emitting diodes comprises a first conductivity type semiconductor layer comprising gallium and nitrogen that is spaced from the first substrate by the respective buffer layer; and
each of the buffer layers consists essentially of gallium nitride.

16. A light emitting diode assembly, comprising:
a backplane containing bonding pads; and first light emitting diodes attached to a first subset of the bonding pads through a respective bonding material portion, wherein each of the first light emitting diodes comprises:
a first conductivity type semiconductor layer; and
a gallium-rich material portion located on a surface of the first conductivity type semiconductor layer and including gallium at an atomic concentration greater than 90%.

17. The light emitting diode assembly of claim 16, wherein each of the gallium-rich material portions includes an atomic concentration of nitrogen atoms that is less than 5%.

18. The light emitting diode assembly of claim 16, wherein the first conductivity type semiconductor layer comprises a crystalline gallium nitride layer.

19. The light emitting diode assembly of claim 16, further comprising second light emitting diodes attached to a second subset of the bonding pads on the backplane through a respective bonding material portion,
wherein each of the second light emitting diodes is configured to emit light of a different peak wavelength than each of the first light emitting diodes; and
wherein each of the second light emitting diodes comprises:
another first conductivity type semiconductor layer; and
another gallium-rich material portion located on a surface of the first conductivity type semiconductor layer and including gallium at an atomic concentration greater than 55%.

20. A transfer method, comprising:
providing a first light emitting diode on a first substrate;
performing a partial laser liftoff of the first light emitting diode from the first substrate;
laser bonding the first light emitting diode to a backplane after performing the partial laser liftoff; and
separating the first substrate from the first light emitting diode after the laser bonding,
wherein:
performing the partial laser liftoff of the first light emitting diode from the first substrate comprises irradiating the first light emitting diode with a detachment laser beam through the first substrate;
the first light emitting diode contains an amorphous buffer layer comprising gallium and nitrogen between the first substrate and a crystalline semiconductor layer of a first conductivity type; and
irradiating the first light emitting diode with the detachment laser beam converts the amorphous buffer layer into liquid gallium-rich drops.

* * * * *